United States Patent
Maeda et al.

(10) Patent No.: US 10,504,609 B2
(45) Date of Patent: Dec. 10, 2019

(54) SEMICONDUCTOR DEVICE AND DIAGNOSIS METHOD THEREOF

(71) Applicant: Renesas Electronics Corporation, Tokyo (JP)

(72) Inventors: Yoichi Maeda, Tokyo (JP); Hideshi Maeno, Tokyo (JP); Jun Matsushima, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 152 days.

(21) Appl. No.: 15/658,734

(22) Filed: Jul. 25, 2017

(65) Prior Publication Data

US 2018/0090225 A1     Mar. 29, 2018

(30) Foreign Application Priority Data

Sep. 29, 2016    (JP) ................................. 2016-190630

(51) Int. Cl.
    *G11C 29/52*         (2006.01)
    *G06F 11/27*         (2006.01)
                 (Continued)

(52) U.S. Cl.
CPC .............. *G11C 29/52* (2013.01); *G06F 11/27* (2013.01); *G11C 29/38* (2013.01); *G11C 29/40* (2013.01); *G11C 29/36* (2013.01); *G11C 29/44* (2013.01); *G11C 2029/0401* (2013.01); *G11C 2029/0407* (2013.01); *G11C 2029/0409* (2013.01)

(58) Field of Classification Search
CPC ......... G11C 29/52; G11C 29/38; G11C 29/40; G11C 29/36; G11C 29/44; G11C 2029/0401; G11C 2029/0407; G11C 2029/0409; G06F 11/27
USPC ....... 714/718, 719, 722, 733, 734, 736, 742; 365/200, 201
See application file for complete search history.

(56) References Cited

U.S. PATENT DOCUMENTS 4,872,168 A * 10/1989 Aadsen .................. G11C 29/10
                                                714/720
5,572,712 A * 11/1996 Jamal .................... G06F 11/267
                                                714/733

(Continued)

FOREIGN PATENT DOCUMENTS

JP         2008-159149 A     7/2008

OTHER PUBLICATIONS

Extended European Search Report received in corresponding European Application No. 17188801.9 dated Mar. 20, 2018.

*Primary Examiner* — John J Tabone, Jr.
(74) *Attorney, Agent, or Firm* — Mattingly & Malur, PC

(57) ABSTRACT

There is to provide a semiconductor device capable of realizing a start time diagnosis on a non-volatile memory without any external device and any non-volatile memory out of a diagnosis target. The non-volatile memory includes an address space formed by addresses continuously read and a reservation address formed by a single or a plurality of addresses, read after the address space. A previously calculated value fixed data is stored in the reservation address. When all the data stored in the address space and the value fixed data are compressed using a predetermined initial value according to a predetermined compression algorithm, the value fixed data is the data for converging the compression value to a predetermined fixed value (for example, 0).

15 Claims, 20 Drawing Sheets

(51) Int. Cl.
  *G11C 29/38* (2006.01)
  *G11C 29/40* (2006.01)
  *G11C 29/36* (2006.01)
  *G11C 29/44* (2006.01)
  *G11C 29/04* (2006.01)

(56) References Cited

U.S. PATENT DOCUMENTS

| | | | | |
|---|---|---|---|---|
| 5,631,913 | A * | 5/1997 | Maeda | G11C 29/36 |
| | | | | 714/726 |
| 5,805,789 | A * | 9/1998 | Huott | G06F 11/2294 |
| | | | | 714/6.32 |
| 6,374,370 | B1 * | 4/2002 | Bockhaus | G06F 11/2236 |
| | | | | 714/30 |
| 6,393,594 | B1 * | 5/2002 | Anderson | G01R 31/3183 |
| | | | | 714/724 |
| 6,553,527 | B1 * | 4/2003 | Shephard, III | G01R 31/3187 |
| | | | | 714/725 |
| 6,694,461 | B1 * | 2/2004 | Treuer | G11C 29/20 |
| | | | | 714/719 |
| 6,769,081 | B1 * | 7/2004 | Parulkar | G11C 29/16 |
| | | | | 714/733 |
| 6,968,478 | B1 * | 11/2005 | Edwards | G06F 11/10 |
| | | | | 714/32 |
| 7,114,110 | B2 * | 9/2006 | Kikuchi | G01R 31/31813 |
| | | | | 324/762.02 |
| 7,225,373 | B1 * | 5/2007 | Edwards | H04L 1/0061 |
| | | | | 714/725 |
| 7,487,420 | B2 * | 2/2009 | Keller | G01R 31/318547 |
| | | | | 714/732 |
| 8,887,018 | B2 * | 11/2014 | Narayanan | G01R 31/318547 |
| | | | | 714/729 |
| 9,404,969 | B1 * | 8/2016 | Keller | G01R 31/31703 |
| 2002/0093356 | A1 * | 7/2002 | Williams | G01R 31/31719 |
| | | | | 324/762.02 |
| 2003/0051197 | A1 * | 3/2003 | Evans | G11C 29/12 |
| | | | | 714/718 |
| 2004/0107395 | A1 * | 6/2004 | Volkerink | G01R 31/31705 |
| | | | | 714/732 |
| 2004/0213058 | A1 * | 10/2004 | Shimizu | G11C 29/44 |
| | | | | 365/200 |
| 2007/0033471 | A1 * | 2/2007 | Damodaran | G01R 31/31724 |
| | | | | 714/733 |
| 2007/0033472 | A1 * | 2/2007 | Damodaran | G01R 31/31724 |
| | | | | 714/733 |
| 2007/0288821 | A1 * | 12/2007 | Matsuo | G01R 31/318547 |
| | | | | 714/728 |
| 2008/0077835 | A1 * | 3/2008 | Khoche | G01R 31/31724 |
| | | | | 714/733 |
| 2008/0126899 | A1 * | 5/2008 | Brennan | G01R 31/31907 |
| | | | | 714/732 |
| 2010/0017664 | A1 * | 1/2010 | Jang | G11C 29/16 |
| | | | | 714/719 |
| 2012/0246527 | A1 * | 9/2012 | Anzou | G11C 29/10 |
| | | | | 714/719 |
| 2014/0258797 | A1 * | 9/2014 | Gorman | G11C 29/40 |
| | | | | 714/719 |
| 2015/0325314 | A1 * | 11/2015 | Ziaja | G11C 29/12 |
| | | | | 365/189.02 |
| 2018/0067164 | A1 * | 3/2018 | Maheshwari | G01R 31/31937 |

* cited by examiner

| ADR | DT (b[7], ..., b[0]) | | | | | | | | | MISR VALUE (b[7], ..., b[0]) | | | | | | | |
|---|---|---|---|---|---|---|---|---|---|---|---|---|---|---|---|---|---|
| 3 | 0 | 0 | 0 | 0 | 0 | 1 | 1 | 0 | → | 0 | 0 | 0 | 0 | 0 | 0 | 0 | 0 |
| 2 | 1 | 0 | 0 | 1 | 1 | 1 | 0 | 0 | → | 0 | 0 | 0 | 0 | 1 | 1 | 0 | 0 |
| 1 | 0 | 0 | 1 | 1 | 0 | 1 | 1 | 0 | → | 0 | 0 | 1 | 0 | 0 | 0 | 0 | 1 |
| 0 | 0 | 0 | 1 | 0 | 1 | 1 | 1 | 0 | → | 0 | 0 | 1 | 0 | 1 | 1 | 1 | 0 |
|  | - | - | - | - | - | - | - | - |  | 0 | 0 | 0 | 0 | 0 | 0 | 0 | 0 |

| ADR | DT (b[3], ..., b[0]) | | | | | MISR VALUE (b[7], ..., b[0]) | | | | | | | |
|---|---|---|---|---|---|---|---|---|---|---|---|---|---|
| B | 1 | 0 | 0 | 0 | → | 0 | 0 | 0 | 0 | 0 | 0 | 0 | 0 |
| A | 1 | 0 | 0 | 0 | → | 0 | 0 | 0 | 0 | 0 | 0 | 0 | 1 |
| 9 | 1 | 0 | 0 | 0 | → | 0 | 0 | 0 | 0 | 0 | 0 | 1 | 1 |
| 8 | 0 | 0 | 0 | 0 | → | 0 | 0 | 0 | 0 | 0 | 1 | 1 | 0 |
| 7 | 0 | 0 | 0 | 0 | → | 0 | 0 | 0 | 0 | 1 | 1 | 0 | 0 |
| 6 | 0 | 0 | 0 | 0 | → | 0 | 0 | 0 | 1 | 1 | 0 | 0 | 0 |
| 5 | 0 | 0 | 0 | 0 | → | 0 | 0 | 1 | 1 | 0 | 0 | 0 | 1 |
| 4 | 1 | 0 | 0 | 0 | → | 0 | 1 | 1 | 0 | 0 | 0 | 1 | 0 |
| 3 | 0 | 1 | 1 | 0 | → | 1 | 1 | 0 | 0 | 0 | 1 | 0 | 0 |
| 2 | 1 | 1 | 0 | 0 | → | 0 | 1 | 0 | 0 | 1 | 0 | 0 | 0 |
| 1 | 0 | 1 | 1 | 0 | → | 0 | 0 | 0 | 1 | 0 | 0 | 0 | 0 |
| 0 | 1 | 1 | 1 | 0 | → | 1 | 1 | 1 | 0 | 0 | 0 | 0 | 0 |
| - | - | - | - | - | | 0 | 0 | 0 | 0 | 0 | 0 | 0 | 0 |

SEMICONDUCTOR DEVICE AND DIAGNOSIS METHOD THEREOF

CROSS-REFERENCE TO RELATED APPLICATIONS

The disclosure of Japanese Patent Application No. 2016-190630 filed on Sep. 29, 2016 including the specification, drawings and abstract is incorporated herein by reference in its entirety.

BACKGROUND

The invention relates to a semiconductor device and a method of diagnosing the semiconductor device and particularly, to a semiconductor device and a method of diagnosing the semiconductor device including a self-diagnosis function of a non-volatile memory.

For example, Japanese Unexamined Patent Application Publication No. 2008-159149 discloses a system LSI including a test circuit for testing Read Only Memory (ROM) at high speed. The test circuit inputs the test address generated by an address generating circuit into ROM and compresses the data output from the ROM corresponding to the input address in a Multiple Input Signature Register (MISR). The data compressed by the MISR is output outside the LSI and compared with the expected value in an external tester.

SUMMARY

These days, according to an increase of capacity in Flash memory that is representative of non-volatile memory, the Flash memory is highly requested to be diagnosed in Built In Self Test (BIST) for functional safety. As the diagnosis method of the Flash memory, for example, there is a method of using Central Processing Unit (CPU) mounted on the same semiconductor chip as the Flash memory. This method, however, increases the diagnostic execution time according to the increasing capacity of the non-volatile memory. Therefore, in order to shorten the diagnostic execution time, there is disclosed a technique of mounting a BIST circuit for exclusive use.

As the method of using the BIST circuit for exclusive use, for example, there is known a method of sequentially generating addresses by an address generating circuit and compressing the read data in the MISR, like Japanese Unexamined Patent Application Publication No. 2008-159149. In the above method, however, an external device such as a tester is required outside the LSI in order to store an expected value and compare the diagnosis result with the expected value. In short, for example, in a system including a non-volatile memory, when a user wants to diagnose the non-volatile memory at start time diagnosis of the system, some external device has to be provided within the system, which may cause a large overhead from the viewpoint of system design.

Then, a method of storing an expected value in a non-volatile memory targeted for diagnosis is considered. In this case, however, it is hard to define the expected value itself. This is because by storing the expected value in the diagnosis target non-volatile memory, another new expected value is generated, getting into a dilemma of causal link. Therefore, in order to provide an expected value within the LSI, for example, another non-volatile memory different from the diagnosis target has to be provided, where the expected value is stored. However, provision of another non-volatile memory increases the overhead and the above non-volatile memory becomes out of the diagnosis target.

The embodiments described later are made taking the above into consideration and other objects and novel characteristics will be apparent from the description of the specification and the attached drawings.

A semiconductor device according to one embodiment includes a non-volatile memory and a BIST circuit for diagnosing the above memory, formed by one semiconductor chip. The BIST circuit includes a reading circuit that sequentially generates addresses and issues the reading commands including the addresses to the non-volatile memory, and a compressor that compresses the data sequentially read in response to the reading commands, according to a predetermined compression algorithm and outputs a signature value as the compression result. The non-volatile memory includes a first address space formed by the addresses continuously read and a first reservation address formed by a single or a plurality of addresses, read after the above address space. Previously calculated first value fixed data is stored in the first reservation address. When all the data stored in the first address space and the first value fixed data are compressed using a predetermined initial value according to a predetermined algorithm, using predetermined value fixed data, the first value fixed data is the data for converging the compression value to a predetermined first fixed value.

According to the embodiment, the start time diagnosis of the non-volatile memory can be realized without any external device and any non-volatile memory out of the diagnosis target.

BRIEF DESCRIPTION OF THE DRAWINGS

FIG. 7A is a circuit diagram showing a structural example of the non-volatile memory and MISR targeted for calculation, and FIG. 7B is a view showing a concrete example of value fixed data of FIG. 7A.

FIG. 9A is a circuit diagram showing a structural example of the non-volatile memory and MISR targeted for calculation and FIG. 9B is a view showing a concrete example of the value fixed data.

DETAILED DESCRIPTION

In the following embodiments, description will be made by dividing into a plurality of sections or embodiments when necessary for the convenience sake, these are not unrelated to each other but are related to each other such that one covers some or all of modified examples, details, supplemental explanation and so forth of the other unless otherwise clearly specified. In addition, in the following embodiments, when the number of elements (including the number of units, a numerical value, an amount, a range and the like) is referred to, it is not limited to the specific number but may be more than or not more than the specific number unless otherwise clearly specified and unless otherwise definitely restricted to the specific number in principle.

In addition, in the following embodiments, it is needless to say that the constitutional element (including an element step) is not necessarily indispensable unless otherwise clearly specified and unless otherwise thought to be clearly indispensable in principle. Likewise, in the following embodiments, when the shapes of the constitutional elements and their positional relationship are referred to, the ones that are substantially approximate or similar to the shapes will be included unless otherwise clearly specified and unless otherwise clearly thought that it is not so in principle. The same also applies to the above-mentioned numerical value and range.

In the following, the embodiments of the invention will be described in detail on the basis of the drawings. In all of the drawings depicted in order to describe the embodiments, the same numerals are assigned to members having the same functions and repetitive description thereof is omitted.

First Embodiment

Schematic Structure of Semiconductor Device (First Embodiment)

Figure 1:
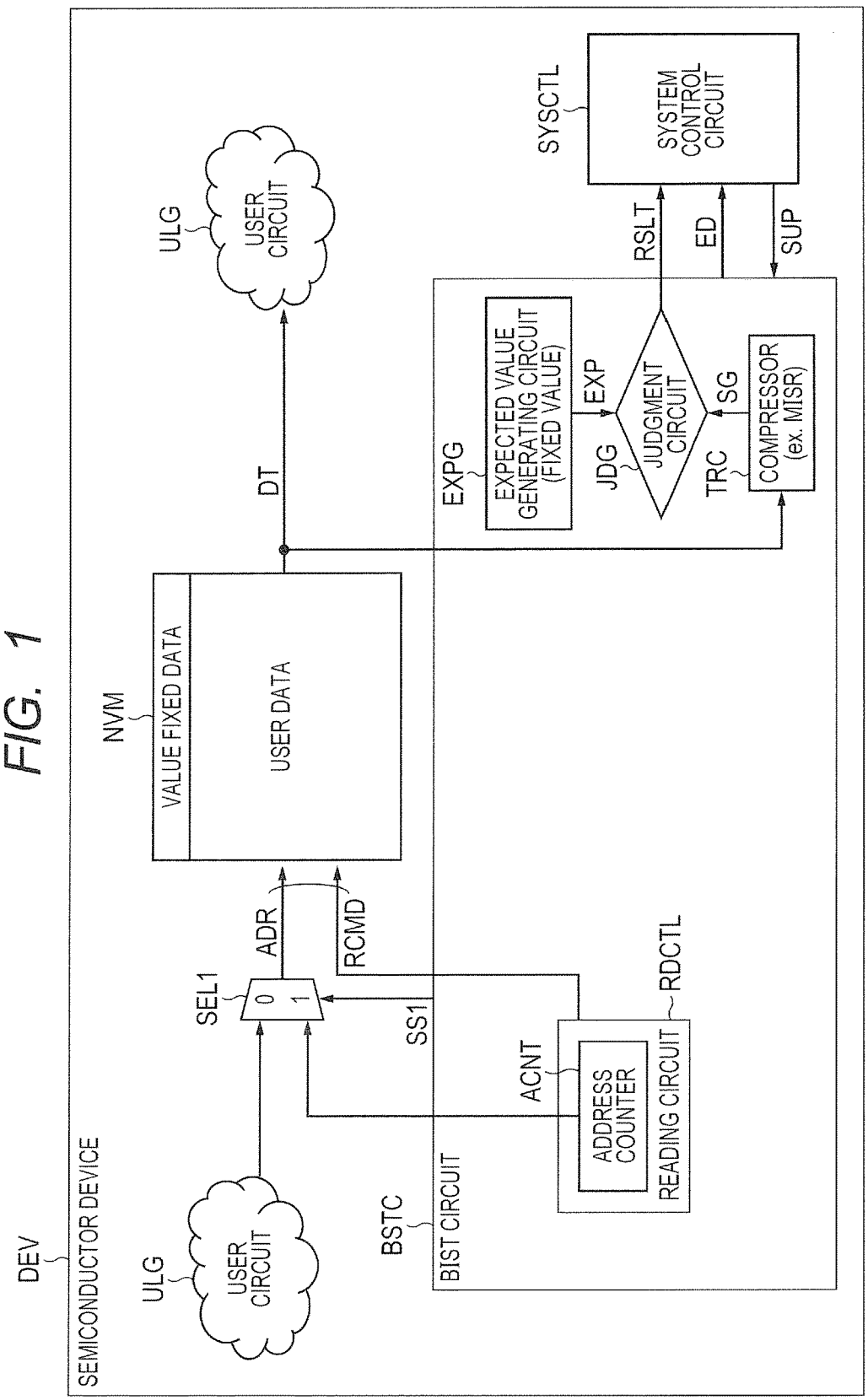
FIG. 1 is a schematic view showing a structural example of a semiconductor device according to a first embodiment of the invention.

FIG. 1 is a schematic view showing a structural example of a semiconductor device according to a first embodiment of the invention. A semiconductor device DEV shown in FIG. 1 is formed by one semiconductor chip and although it is not particularly restricted, a micro controller chip. The semiconductor device DEV includes a user circuit ULG typified by CPU, a non-volatile memory NVM typified by Flash memory, a BIST circuit BSTC that diagnoses the non-volatile memory NVM, a selector SEL1, and a system control circuit SYSCTL.

The selector SEL1 selects an address ADR from the user circuit ULG or the BIST circuit BSTC and outputs the above to the non-volatile memory NVM. The data DT read from the non-volatile memory NVM is output to the user circuit ULG and the BIST circuit BSTC in response to the input of this address ADR. The system control circuit SYSCTL is a boot controller for controlling various sequences at boot time in the whole semiconductor device DEV including the BIST circuit BSTC. The non-volatile memory NVM stores a program, for example, executed by the CPU and the user circuit ULG reads out the program and executes the same.

The BIST circuit BSTC includes a reading circuit RDCTL, a compressor TRC, an expected value generating circuit EXPG, and a judgment circuit JDG. The reading circuit RDCTL sequentially generates addresses by using an address counter ACNT and sequentially issues reading commands RCMD including the generated addresses and various command signals to the non-volatile memory NVM. The sequence of generating addresses is typically determined by increment; however, it is not restricted to this but may be any sequence having some regularity.

The compressor TRC, that is representatively MISR, compresses the data DT sequentially read from the non-volatile memory NVM in response to the reading commands RCMD, according to a predetermined compression algorithm and outputs a signature value SG as the compression result. The expected value generating circuit EXPG generates an expected value EXP. The judgment circuit JDG is, for example, a comparator, which judges whether or not the expected value EXP agrees with the signature value SG, hence to output the judgment result RSLT.

Figure 2:
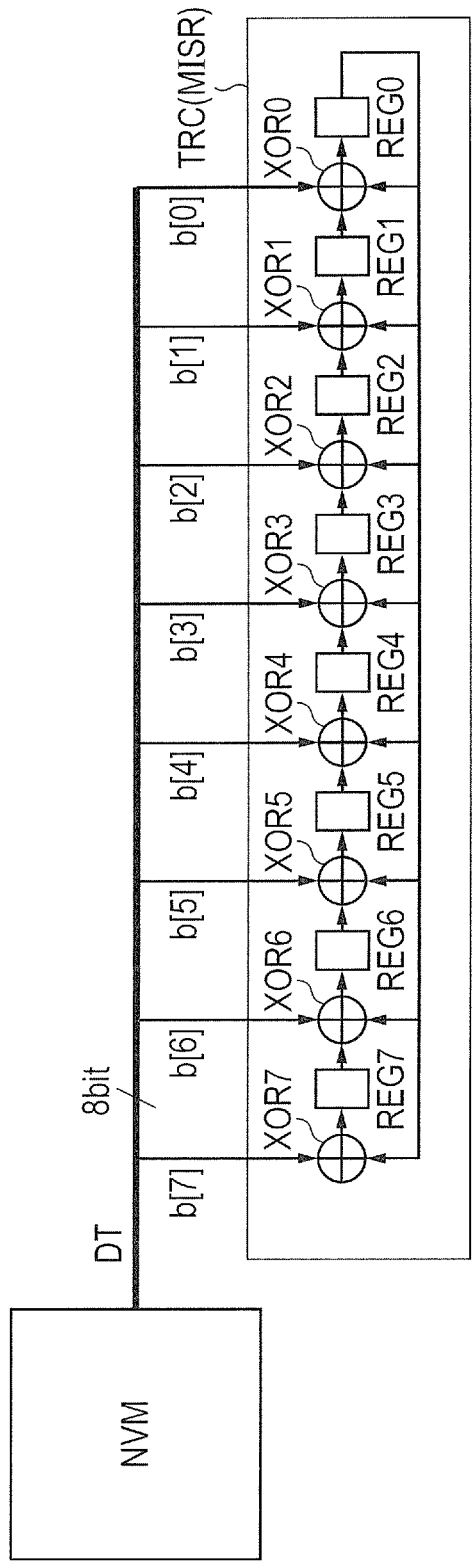
FIG. 2 is a circuit diagram showing a structural example of a compressor in FIG. 1.

FIG. 2 is a circuit diagram showing a structural example of the compressor TRC in FIG. 1. The compressor TRC shown in FIG. 2 is the MISR, including feedback shift registers REG0 to REG7 formed by a plurality of bits (here, 8 bits) and EXOR circuits XOR0 to XOR7 inserted into the respective registers. The bits (here, 8 bits) b[0] to b[7] of the data DT read from the non-volatile memory NVM are respectively input to the shift registers REG0 to REG7 through the EXOR circuits XOR0 to XOR7.

Further, in this example, the output of the register REG0 is returned to the registers REG3 to REG5 and REG7 through the EXOR circuits XOR3 to XOR5 and XOR7. The MISR thus constituted compresses the data DT read in time series into 8 bits in a time direction. The structure of the MISR is not restricted to the structure of FIG. 2 but there are various types of MISRs. As the basic structure, the MISR is formed by a combination of the feedback shift registers and the EXOR circuits, and the compression algorithm (calculation formula of compression) varies according to the above combination, the number of bits of the shift registers, and the feedback method. The compression value (MISR value) by the MISR is determined by this compression algorithm, the initial value of the shift register, and the input data.

The compression value (MISR value) by the MISR is generally referred to as signature value. In this specification, however, although the details will be described later, for example, in order to clearly distinguish the MISR value calculated by a simulation based on the structure of the MISR of FIG. 2 from the MISR value obtained by the actual compressor TRC within the semiconductor device DEV, only the MISR value of the latter is referred to as signature value SG. In the following description, it is assumed that the compressor TRC is the MISR.

Procedure of Self-Diagnosis

Figure 3:
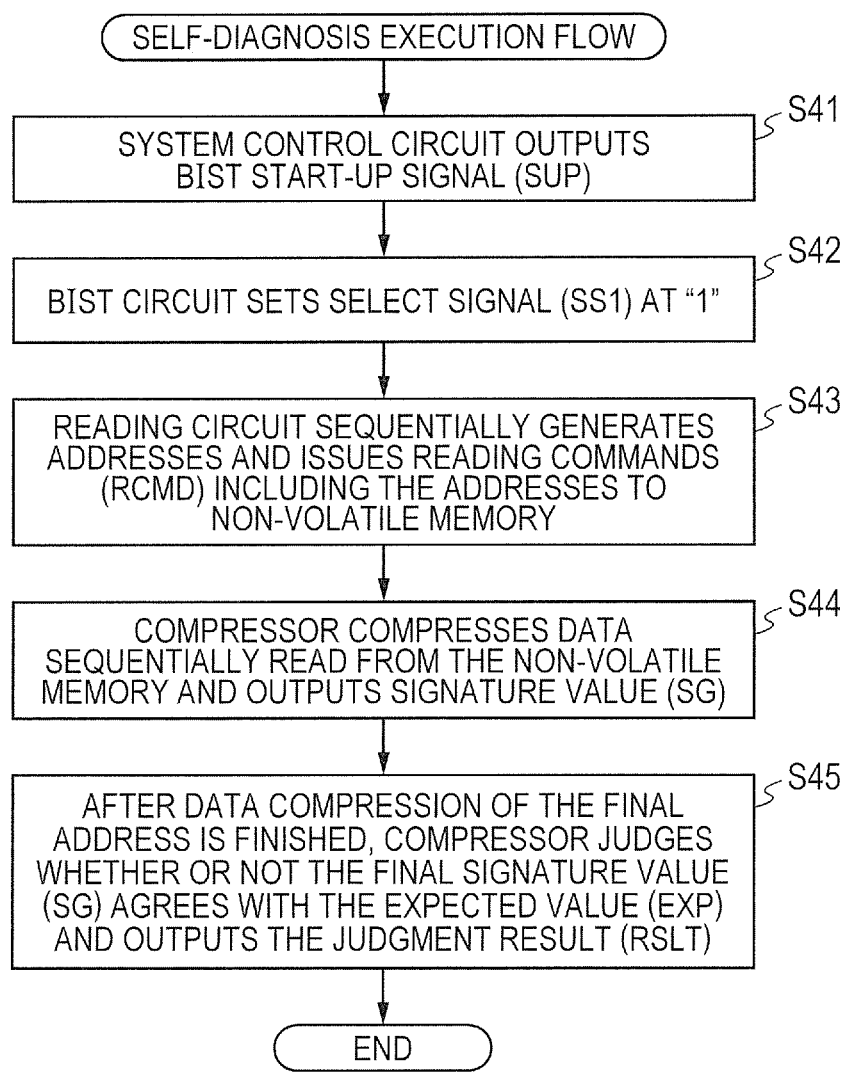
FIG. 3 is a flow chart showing an example of procedure of executing a self-diagnosis in the semiconductor device of FIG. 1.

FIG. 3 is a flow chart showing one example of procedure of executing a self-diagnosis in the semiconductor device of FIG. 1. At first, the system control circuit SYSCTL outputs a BIST start-up signal SUP to the BIST circuit BSTC (Step S41). In response to this, the BIST circuit BSTC sets a select signal SS1 at 37 1" so that the selector SEL1 may select an address from the BIST circuit BSTC (Step S42). The reading circuit RDCTL sequentially generates addresses and issues the reading commands RCMD including the addresses to the non-volatile memory NVM (Step S43).

The compressor TRC compresses the data DT sequentially read from the non-volatile memory NVM in response to the reading commands RCMD in a time direction and outputs the signature value SG as the compression result (Step S44). After the compression of the data DT according to the reading command RCMD of the final address is finished, the judgment circuit JDG judges whether or not the final signature value SG agrees with the expected value EXP and outputs the judgment result RSLT to the system control circuit SYSCTL (Step S45). Further, the BIST circuit BSTC outputs an end signal ED together with the judgment result RSLT concerned about the final signature value SG. The system control circuit SYSCTL takes in the judgment result RSLT, triggered by the end signal ED and judges the presence of error about the reading operation of the non-volatile memory NVM.

Schematic Structure and Problem of Semiconductor Device (Comparison Example)

Figure 20:
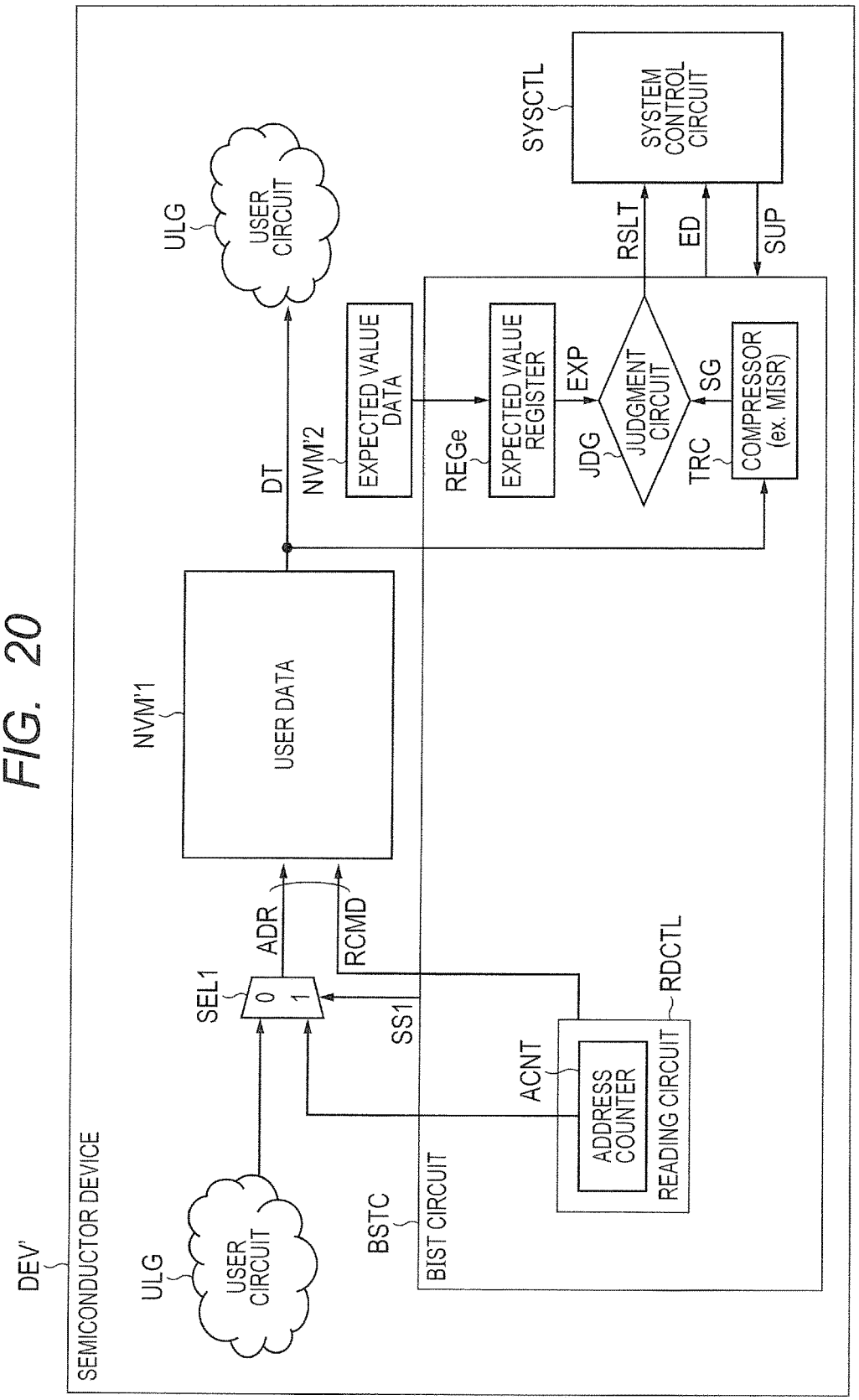
FIG. 20 is a schematic view showing a structural example of a semiconductor device examined as a comparison example of the invention.

FIG. 20 is a schematic view showing a structural example of a semiconductor device examined as a comparison example of the invention.

A semiconductor device DEV' shown in FIG. 20 includes a non-volatile memory NVM' 2 for storing the expected value data, in addition to the structure of FIG. 1. An expected value register REGe holds the expected value data stored in the non-volatile memory NVM' 2. The expected value data is the compression value obtained by compressing all the data stored in the non-volatile memory NVM' 1 according to a predetermine compression algorithm used in the compressor TRC, which is previously calculated by the simulation, based on the structure of the MISR as shown in FIG. 2.

If the expected value data is stored into the non-volatile memory NVM' 1, the same expected value data becomes a compression target and new expected value data is generated. When the newly generated expected value data is stored in the non-volatile memory NVM' 1, further new expected value data is generated. This dilemma of causal link occurs, which makes it difficult to store the expected value data in the non-volatile memory NVM' 1.

Therefore, the expected value data is stored in the other non-volatile memory NVM' 2 as shown in FIG. 20 or in an external device outside the semiconductor device DEV'. In this case of providing the other non-volatile memory NVM' 2 and the external device, however, there is a fear of increasing the overhead. Because the same dilemma of causal link occurs also in the non-volatile memory NVM' 2, the non-volatile memory NVM' 2 should be a memory out of diagnosis target.

Data Structure of Non-Volatile Memory (First Embodiment)

Figure 4:
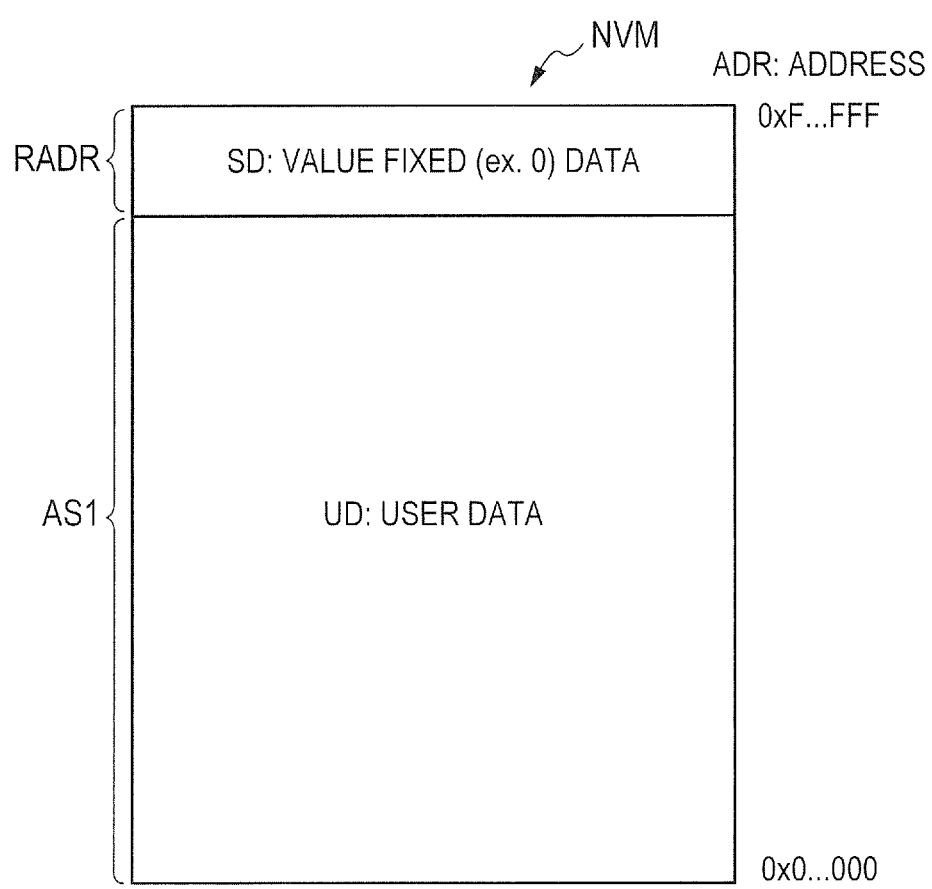
FIG. 4 is a view showing one example of a data structure of a non-volatile memory in FIG. 1.

FIG. 4 is a view showing one example of a data structure of a non-volatile memory in FIG. 1. The non-volatile memory NVM shown in FIG. 4 includes an address space AS1 and a reservation address RADR. The address space AS1 is formed by the addresses continuously read, with the generation sequence of the addresses (typically, increment) by the reading circuit RDCTL as a reference, where the user data UD is stored. The user data UD is, for example, data for ROM hardly changed, typically including program and various types of fixed parameters.

The reservation address RADR is read after one of the address space AS1 and formed by a single or a plurality of addresses. In the reservation address RADR, value fixed data SD previously calculated is stored. When all the data stored in the address space AS1 and the value fixed data SD are compressed according to a predetermined compression algorithm used in the compressor TRC and the generation sequence of the addresses used in the reading circuit RDCTL, using a predetermined initial value, the value fixed data SD is the data for converging the compression value to a predetermined fixed value. The predetermined initial value is the value actually used in the compressor TRC, typically 0. The fixed value can be arbitrarily determined, typically 0.

When executing the flow of FIG. 3 on the target of the non-volatile memory NVM having the above data structure, as far as there is no error in the non-volatile memory NVM, the final signature value SG becomes the fixed value (for example, 0) that is the convergence value by the value fixed data SD. The expected value generating circuit EXPG generates this predetermined fixed value and the judgment circuit JDG judges whether or not the fixed value as the expected value EXP agrees with the signature value SG, hence to be able to diagnose the non-volatile memory NVM. As the result, differently from the case of FIG. 20, it is possible to diagnose the non-volatile memory NVM at start-up without any external device and the non-volatile memory NVM' 2 that is out of the diagnosis target.

The judgment circuit JDG and the expected value generating circuit EXPG may be installed within the user circuit ULG, depending on the occasion. In this case, the user circuit ULG obtains the signature value SG that can be obtained by the operation of the BIST circuit BSTC and judges whether or not the above agrees with the predetermined fixed value. Specifically, for example, the BIST circuit BSTC executes the start time diagnosis after turning on the power and holds the signature value SG as the diagnosis result. After the operation of the BIST circuit BSTC, for example, CPU within the user circuit ULG starts up and the CPU obtains the signature value SG and makes the judgment during the software processing after the start-up. However, the CPU is generally activated on the assumption that the non-volatile memory NVM (in other words, program and the like) is normal and from this viewpoint, the judgment circuit JDG and the like are preferably mounted in the BIST circuit BSTC.

Self-Diagnosis Operation Flow

Figure 5:
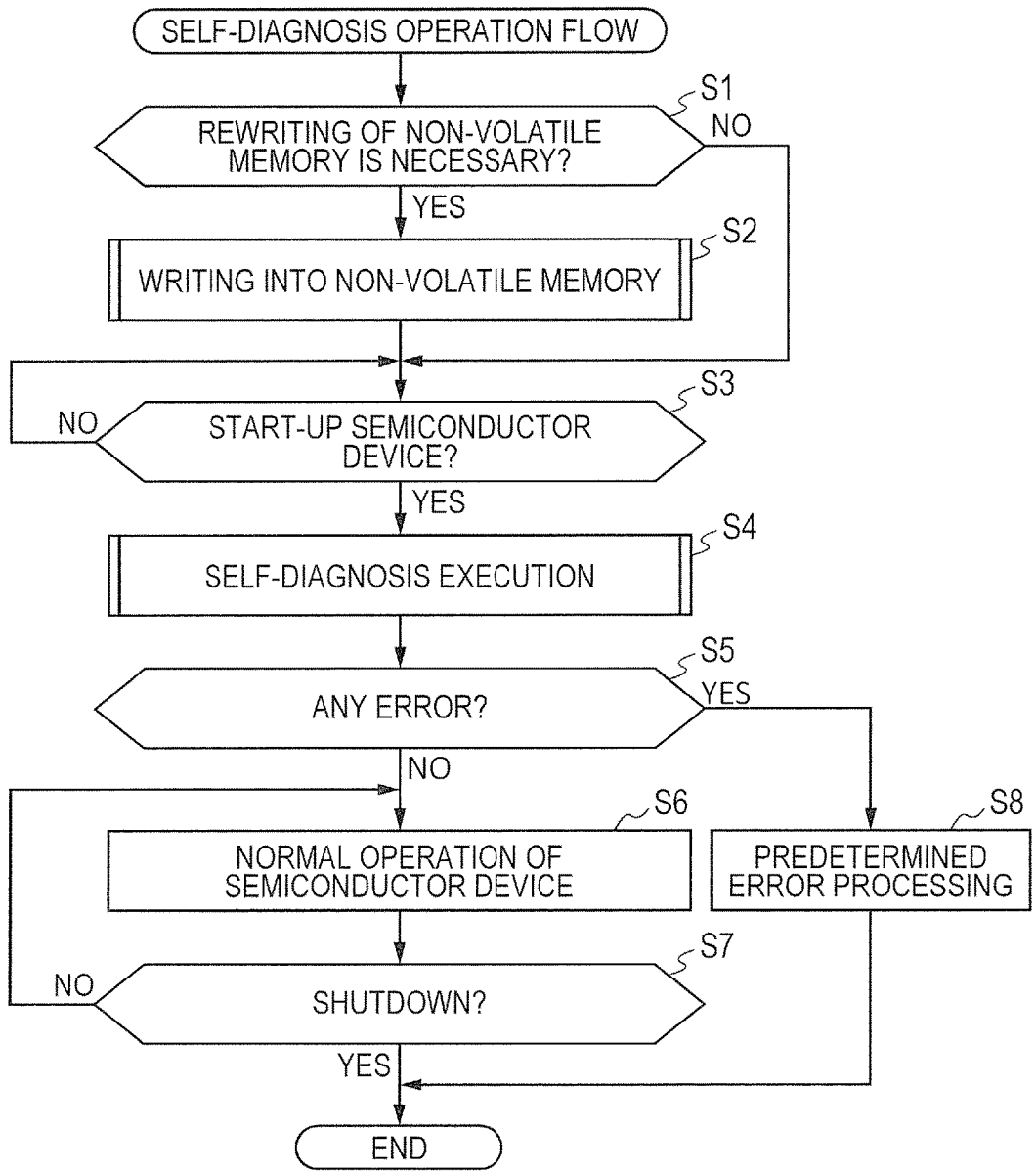
FIG. 5 is a flow chart showing one example of a method of using a system with the semiconductor device of FIG. 1 mounted.

FIG. 5 is a flow chart showing one example of an operation method of a system with the semiconductor device of FIG. 1 mounted. At first, a user occasionally wants to rewrite the non-volatile memory NVM, for example, update a program during the operation of the system. When rewriting of the non-volatile memory NVM is necessary (Step S1), the semiconductor device DEV starts up (Step S3) after writing data into the non-volatile memory NVM (Step S2). On the other hand, when the writing of the non-volatile memory NVM is not necessary (Step S1), the semiconductor device DEV stats up as it is (Step S3).

Upon start-up of the semiconductor device DEV, a self-diagnosis is performed according to the flow shown in FIG. 3 (Step S4). When there is no error in the self-diagnosis result (Step S5), for example, the user circuit ULG is activated continuously by the system control circuit SYS-CTL and the semiconductor device DEV moves into the normal operation (Step S6). On the other hand, when there is some error in the self-diagnosis result (Step S5), predetermined error processing determined by the system is performed (Step S8). The semiconductor device DEV in the normal operation continuously keeps the normal operation until shutdown (Step S7).

Writing Procedure of Non-Volatile Memory

Figure 6A:
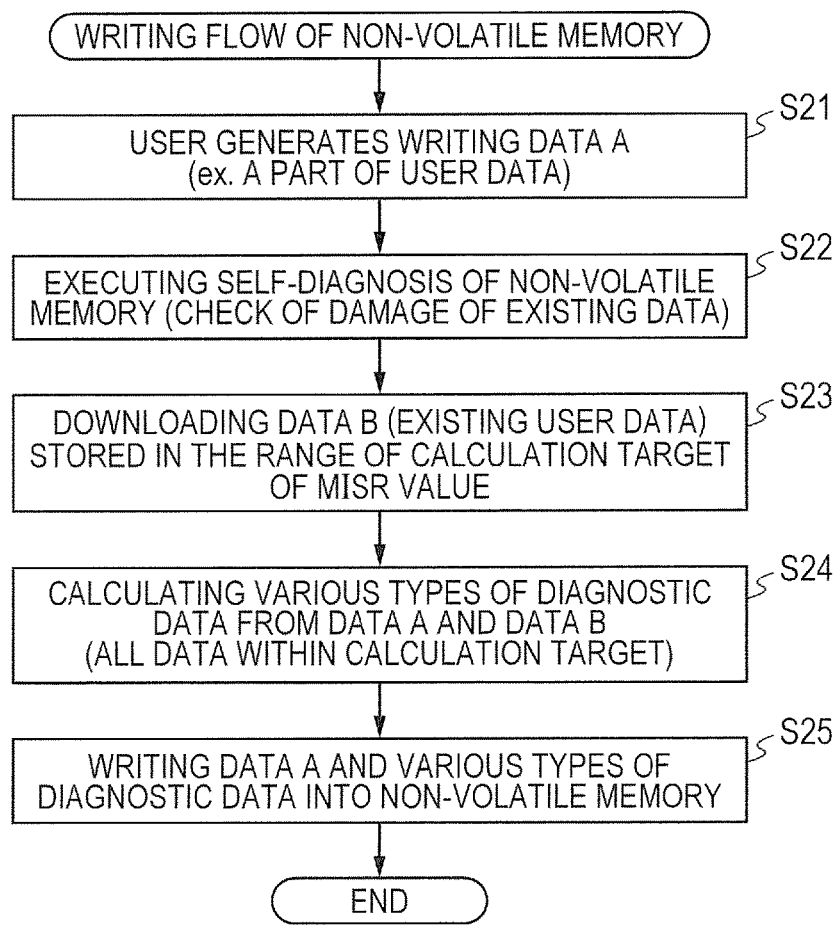
FIG. 6A is a flowchart showing one example of the processing in writing data into the non-volatile memory in FIG. 5.
Figure 6B:
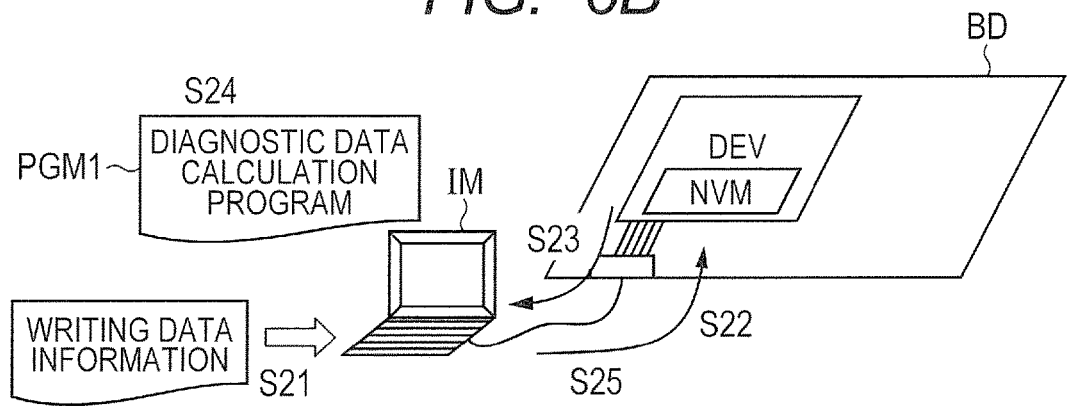
FIG. 6B is a supplemental view of FIG. 6A.

FIG. 6A is a flow chart showing one example of the processing for writing data into the non-volatile memory in FIG. 5 (Step S2) and FIG. 6B is a supplemental view of FIG. 6A. The semiconductor device DEV as shown in FIG. 1 is generally used being mounted on the wiring substrate BD forming a predetermined system as shown in FIG. 6B. For example, when the semiconductor device DEV is an automobile microcontroller, the wiring substrate BD corresponds to the Electronic Control Unit (ECU) substrate.

Data writing (or rewiring) into the non-volatile memory NVM within the semiconductor device DEV is performed, for example, by coupling an information processing unit IM to an external communication terminal (typically, Joint Test Action Group (JTAG) terminal) provided in the wiring substrate BD. The information processing unit IM, with a predetermined data writing program including a diagnostic data calculation program PGM1 mounted there as a tool, can perform the writing into the non-volatile memory NVM by the CPU and the like executing the data writing program.

In FIG. 6A, when a system user wants to modify, for example, a program, the user generates writing data A as the modification data on the information processing unit IM (Step S21). In this example, the writing data A is not all the user data (for example, program) but a part of the above. Continuously, the information processing unit IM performs the following processing based on the tool.

At first, the information processing unit IM executes the self-diagnosis of the non-volatile memory NVM and checks a damage on the existing user data stored in the non-volatile memory NVM (Step S22). Then, the information processing unit IM downloads data B (specifically, existing user data) stored in the range of calculation target of the MISR value, from the non-volatile memory NVM (Step S23). The range of the calculation target is, for example, all the user data UD stored in the address space AS1 in the case of FIG. 4.

The information processing unit IM determines the final user data UD by substituting the data A for a part of the downloaded data B and calculates various types of diagnostic data using the user data UD by executing the diagnostic data calculation program PGM1 (Step S24). In the case of FIG. 4, the information processing unit IM calculates the value fixed data SD that is various types of diagnostic data, using the user data UD of the address space AS1. Then, the information processing unit IM writes the data A and the various types of diagnostic data into the non-volatile memory NVM (Step S25). Specifically, the information processing unit IM writes the data A in the address space AS1 and writes the value fixed data SD in the reservation address RADR.

When the data generated in Step S21 is all the user data UD, the processing of Steps S22 and S23 can be omitted. Although the data A and the value fixed data SD are written in Step S25, for example, when the non-volatile memory NVM is a Flash memory, only the data A and the value fixed data SD cannot be sometimes rewritten because of the restriction of the erasing unit. In this case, the data of the erasing unit including the data A and the value fixed data SD is generated and the data is written by this erasing unit.

Figures 7A, 7B:
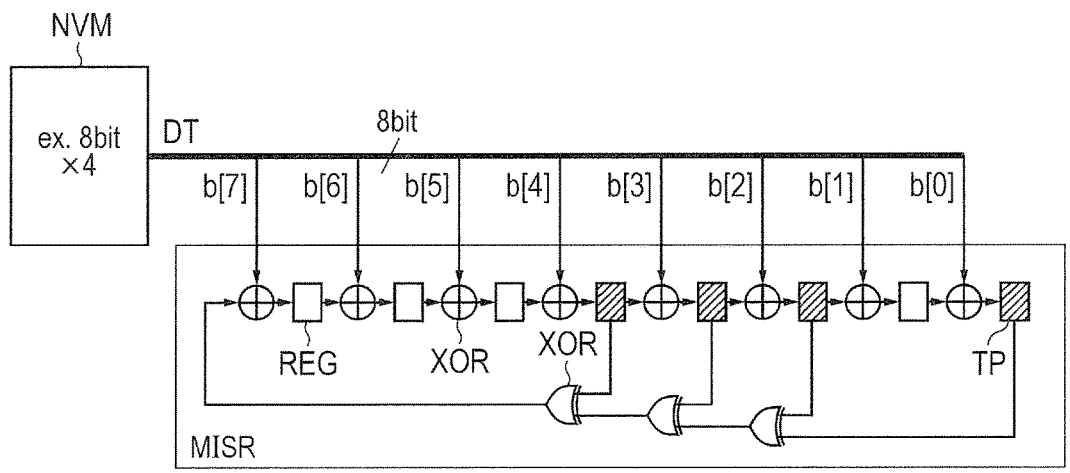
FIGS. 7A and 7B are views for use in describing one example of a diagnostic data calculation program in FIG. 6B.
Figure 8:
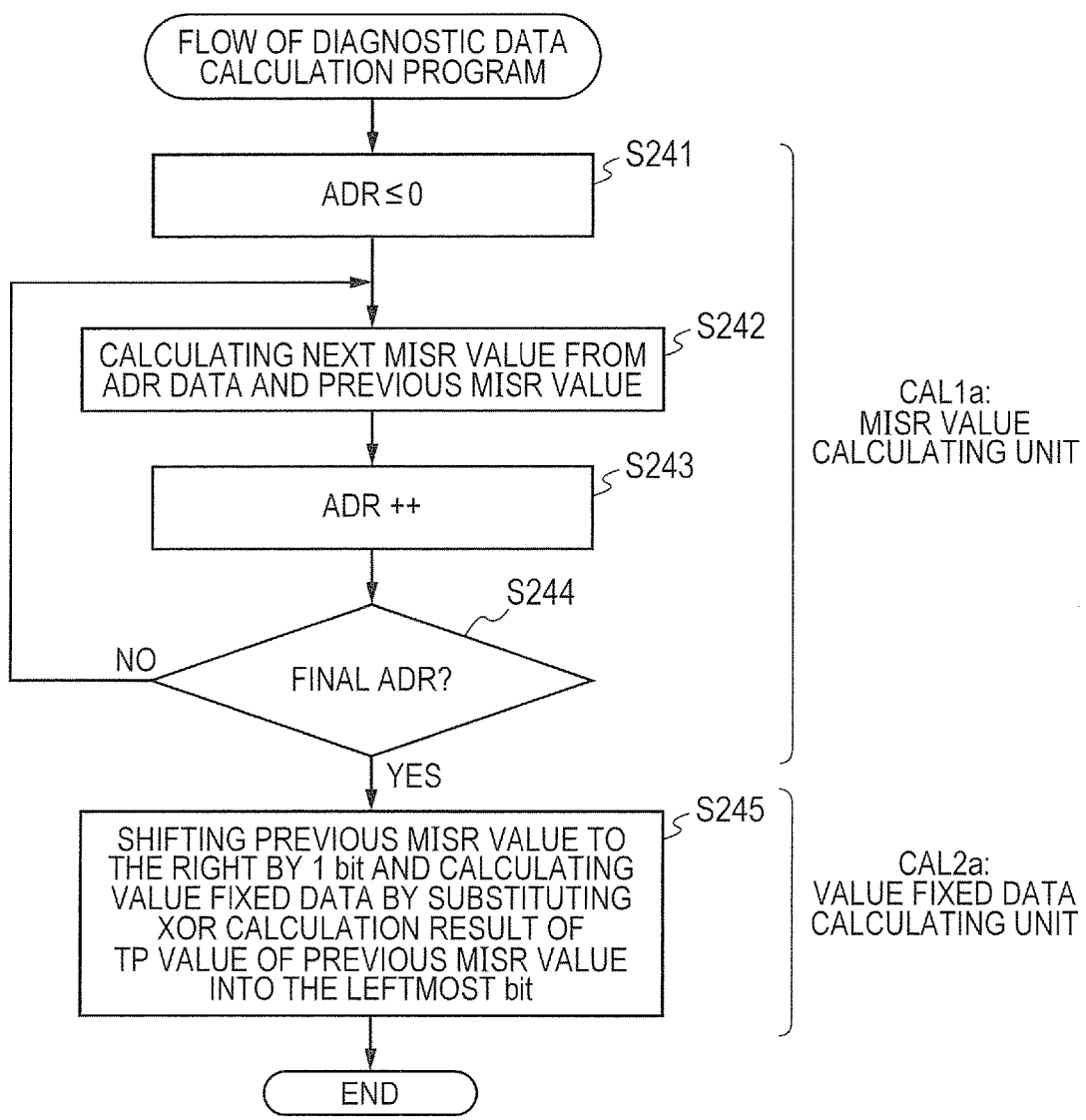
FIG. 8 is a flow chart showing one example of the processing of the diagnostic data calculation program when the structure of FIG. 7A is targeted for calculation.

FIGS. 7A and 7B are views for use in describing one example of the diagnostic data calculation program in FIG. 6B; FIG. 7A is a circuit diagram showing a structural example of the non-volatile memory and MISR targeted for calculation and FIG. 7B is a view showing a concrete example of the value fixed data of FIG. 7A. FIG. 8 is a flow chart showing one example of the processing of the diagnostic data calculation program when the structure of FIG. 7A is targeted for calculation. The processing of FIG. 8 represents the details of the processing of Step S24 in FIG. 6A.

Here, assume that the non-volatile memory NVM and the compressor TRC of FIG. 1 has the structure as shown in FIG. 7A. FIG. 7A shows the structure in the case of compressing the data DT read from the non-volatile memory NVM "8 bits×4" by the MISR. The MISR is formed by a combination of shift registers including a plurality of registers REG (here for 8 bits) and EXOR circuits XOR, as having been mentioned in FIG. 2. In the example of FIG. 7A, the respective values of the registers REG of bit b[0], b[2] to b[4] are returned to bit b[7]. This feedback register is referred to as tap TP, and the compression algorithm (calculation formula of compression) varies depending on the position where to provide the tap TP.

FIG. 7B shows the data DT stored in the non-volatile memory NVM and the changing state of the MISR value when reading the data DT to the MISR sequentially from the lower side of the addresses ADR. The initial value of the MISR is "00000000". When the data "00101110" of the address ADR=0 is input to the MISR having the initial value, the MISR value "00101110" is obtained. When repeating this processing while incrementing the addresses ADR one by one, the MISR value as the result of inputting the data of the address ADR=2 becomes "00001100".

The data of the address ADR=3 is the value fixed data SD. The value fixed data SD can be obtained from the MISR value calculated with the data up to the address ADR=2 and the predetermined arbitrary fixed value (0 in this example). In the case of this example, the MISR value up to the address ADR=2 is "00001100" and the fixed value is "00000000". The value fixed data SD is calculated by shifting the MISR value up to the address ADR=2 to the right by 1 bit and inputting the output value of the EXOR tree to the leftmost bit (here, b[7]), which results in "00000110". The EXOR tree is the EXOR calculation result of the tap TP value.

In FIG. 8, the diagnostic data calculation program PGM1 at first sets the address ADR at 0 (Step S241) and calculates the next MISR value ("00101110" in FIG. 7B) according to the data DT ("00101110" in FIG. 7B) of the address and the previous MISR value ("00000000" in FIG. 7B) (Step S242). Then, the diagnostic data calculation program PGM1 similarly calculates the last MISR value before the final address while incrementing the addresses ADR one by one and the processing is moved to Step S245 at a time of arriving at the final address (4 in FIG. 7B) (Steps S243 and S244).

In Step S245, the diagnostic data calculation program PGM1 shifts the previous MISR value ("00001100" in FIG. 7B) to the right by 1 bit and substitutes the output value of the EXOR tree of the previous MISR value into the leftmost bit, hence to calculate the value fixed data SD. In FIG. 8, the information processing unit IM works as an MISR value calculating unit CAL1a and a value fixed data calculating unit CAL2a by running the diagnostic data calculation program PGM1 in the CPU. The MISR value calculating unit CAL1a executes the processing of Steps S241 to S244 and the value fixed data calculating unit CAL2a executes the processing of Step S245.

Figures 9A, 9B:
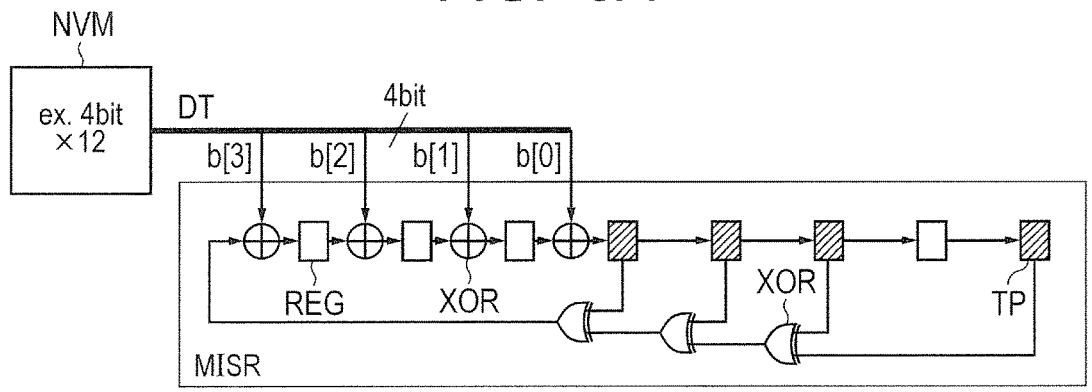
FIGS. 9A and 9B are views for use in describing another example of the diagnostic data calculation program in FIG. 6B.
Figure 10:
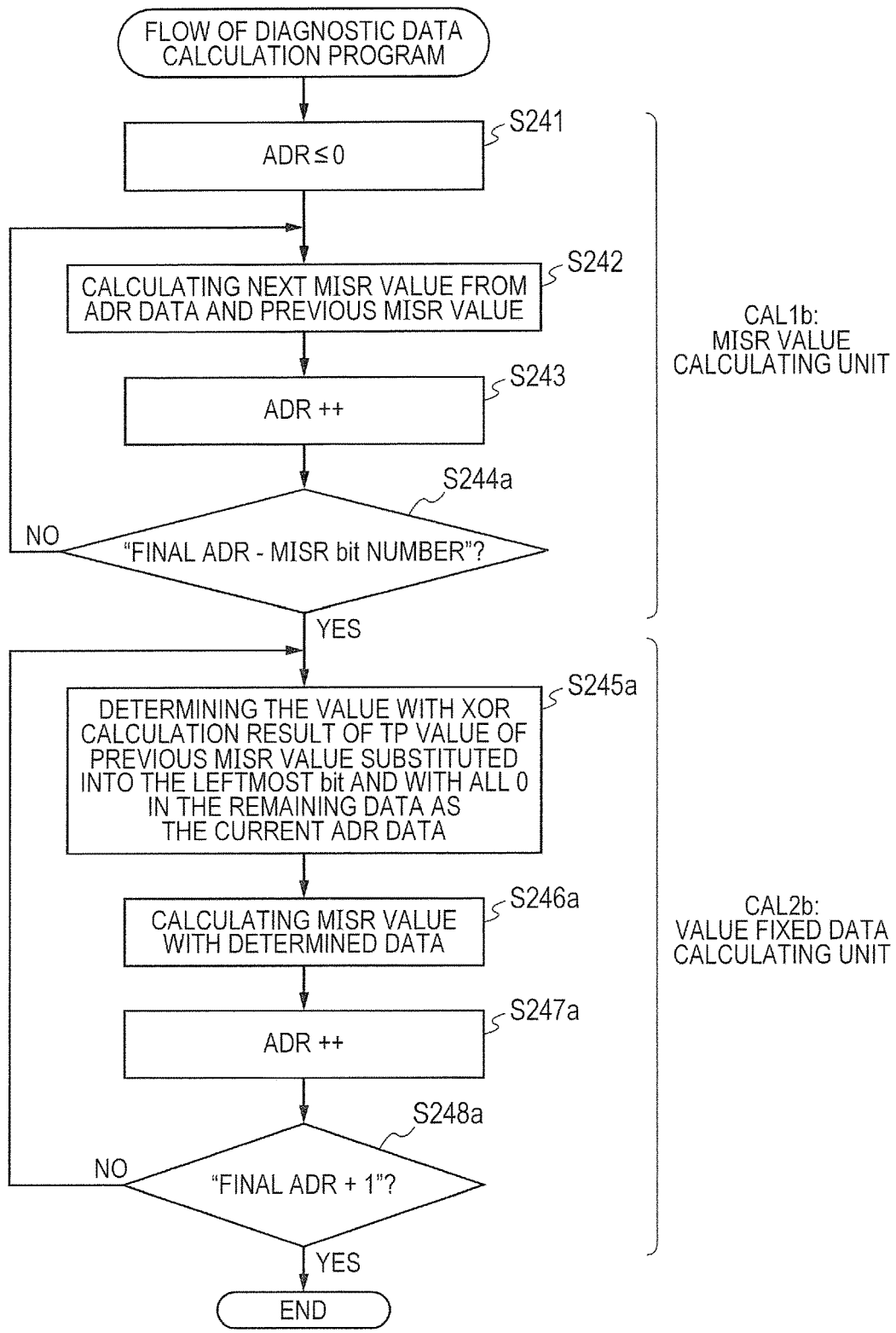
FIG. 10 is a flow chart showing one example of the processing of the diagnostic data calculation program when the structure of FIG. 9A is targeted for calculation.

FIGS. 9A and 9B are views for use in describing another example of the diagnostic data calculation program of FIG. 6B; FIG. 9A is a circuit diagram showing a structural example of the non-volatile memory and MISR targeted for calculation, and FIG. 9B is a view showing a concrete example of the value fixed data of FIG. 9A. FIG. 10 is a flow chart showing one example of the processing of the diagnostic data calculation program when the structure of FIG. 9A is targeted for calculation. The processing of FIG. 10 represents the details of the processing of Step S24 in FIG. 6A.

Here, assume that the non-volatile memory NVM and the compressor TRC in FIG. 1 have the structure as shown in FIG. 9A. FIG. 9A shows the structure in the case of compressing the data DT read from the non-volatile memory NVM "4 bits×12" by the MISR. The MISR is formed by a combination of the shift registers for 8 bits of the registers REG and EXOR circuits XOR. The position of the tap TP is similar to the case of FIG. 7A. The data DT for 4 bits read from the non-volatile memory NVM is input to 4 bits in the left of the 8 bit registers REG through the EXOR circuits XOR, differently from the case of FIG. 7A.

FIG. 9B shows the data DT stored in the non-volatile memory and the changing state of the MISR value when reading the above data DT to the MIST sequentially from the lower side of the address ADR. The initial value of the MISR is defined as "00000000". When the date "1110" of the address ADR=0 is input in the 4 bits of the registers REG for 8 bits, "11100000" is obtained as the MISR value. Repeating this processing by incrementing the addresses ADR one by one, the MISR value as the result of inputting the data of the address ADR=3 becomes "11000100".

The data of the address ADR=4 to B is the value fixed data SD. Thus, the value fixed data SD is formed by a plurality of addresses ADR in some cases. Because the bit number of the MISR is larger than the bit number of the diagnosis target non-volatile memory NVM, the plural addresses ADR are used, and in order to fix the MISR value, the addresses ADR for the bit number of the MISR at the maximum are required. The value fixed data SD can be required by the MISR value calculated with the data up to the address ADR=3 and the predetermined arbitrary fixed value (0 in this example).

In this example, for the sake of simplicity, the value fixed data SD is set at the active value only in the leftmost bit and all 0 in the remaining bits. The output value of the EXOR tree in the previous MISR value is input in the leftmost bit. For example, when the address ADR=4, the output value of the EXOR tree (EXOR calculation result of the bit b [0], b[2] to b [4]) is calculated on the MISR value "11000100" corresponding to the data of the previous address ADR=3, and the result "1" is set at the leftmost bit value. The remaining bits are all set at "0"; as the result, the value of the address ADR=4 in the value fixed data SD becomes "1000". By repeating this processing for the bit number of the MISR, the value fixed data SD formed by the eight addresses ADR (4 to B) can be calculated.

In FIG. 10, the diagnostic data calculation program PGM1 at first sets the address ADR at 0 (Step S241), similarly to the case of FIG. 8 and calculates the next MISR value from the data DT of the above address and the previous MISR value (Step S242). Next, the diagnostic data calculation program PGM1 similarly calculates the MISR value while incrementing the addresses ADR one by one. Here, differently from the case of FIG. 8, the program calculates the MISR value up to one address prior to "final address–MISR bit number" (3 in the case of FIG. 9B). At a time of arriving at the "final address–MISR bit number" (4 in FIG. 9B), the processing is moved to Step S245a (Steps S243 and S244a).

In Step S245a, the diagnostic data calculation program PGM1 substitutes the output value of the EXOR tree of the previous MISR value ("11000100" in FIG. 9B) into the leftmost bit (here, bit b[3]) and sets the remaining bits at all "0", which is determined as the data of the current address ADR (=4). Continuously, the diagnostic data calculation program PGM1 calculates the MISR value with the determined data (Step S246a). The diagnostic data calculation program PGM1 repeatedly executes the processing of Steps S245a and S246a to the final address (B in the case of FIG. 9B) while incrementing the addresses ADR one by one (Steps S247a and S248a). According to this, all the value fixed data SD is calculated.

In FIG. 10, the information processing unit IM works as the MISR value calculating unit CAL1b and the value fixed data calculating unit CAL2b by executing the diagnostic data calculation program PGM1 using the CPU. The MISR value calculating unit CAL1b executes the processing of Steps S241 to S244a and the value fixed data calculating unit CAL2b executes the processing of Steps S245a to S248a.

Main Effect of First Embodiment

As mentioned above, according to the first embodiment, by using the value fixed data SD, the expected value (specifically, the fixed value by the value fixed data SD) can be actually stored in the diagnosis target non-volatile memory and the diagnosis of the address (reservation address RADR) with the expected value stored is enabled. Further, since the expected value becomes fixed, reading of the expected value in the initial operation and the register to store the expected value are not required. As the result, differently from the case of FIG. 20, it is possible to realize the start time diagnosis of the non-volatile memory without any external device and any non-volatile memory out of the diagnosis target. According to this, overhead accompanying the self-diagnosis can be suppressed.

Second Embodiment

The above mentioned first embodiment has to provide the reservation address RADR within the final address portion in order to store the expected value. Here, it is sometimes difficult to cope with the case of using, for example, the final address portion for the user data UD. In this case, a method of a second embodiment is useful.

Schematic Structure of Semiconductor Device (Second Embodiment)

Figure 11:
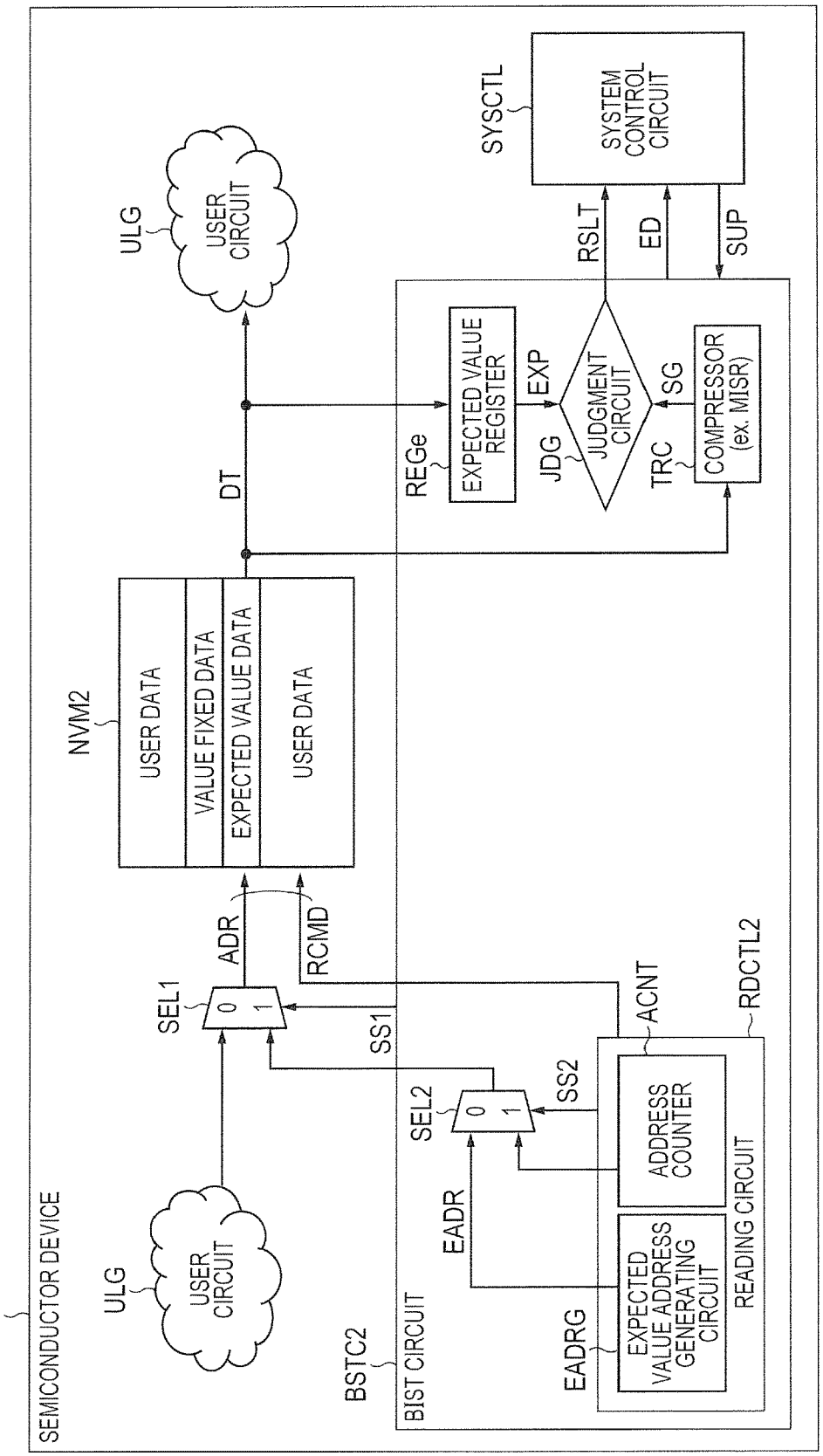
FIG. 11 is a schematic view showing a structural example of a semiconductor device according to a second embodiment of the invention.

FIG. 11 is a schematic view showing a structural example of a semiconductor device according to the second embodiment of the invention. Compared with the structural example of FIG. 1, the semiconductor device DEV shown in FIG. 11 includes a non-volatile memory NVM2 having a different data structure and a BIST circuit BSTC2 having a different structure from those of FIG. 1. The BIST circuit BSTC2 is different from the BIST circuit BSTC of FIG. 1 in some points; the structure of a reading circuit RDCTL2, provision of a selector SEL2, and provision of an expected value register REGe instead of the expected value generating circuit EXPG.

The reading circuit RDCTL2 includes an expected value address generating circuit EADRG that generates an expected value address EADR, in addition to the similar address counter ACNT to the case of FIG. 1. According to this, the reading circuit RDCTL2 also works as an expected value address reading circuit that issues the reading command RCMD including the expected value address EADR to the non-volatile memory NVM2. The selector SEL2 selects one of the address ADR from the address counter ACNT and the expected value address EADR from the expected value address generating circuit EADRG and outputs the above to the non-volatile memory NVM2 through the selector SEL1. The expected value register REGe holds the data read from the expected value address EADR according to the reading command RCMD of the reading circuit (expected value address reading circuit) RDCTL2.

Data Structure of Non-Volatile Memory (Second Embodiment)

Figure 12:
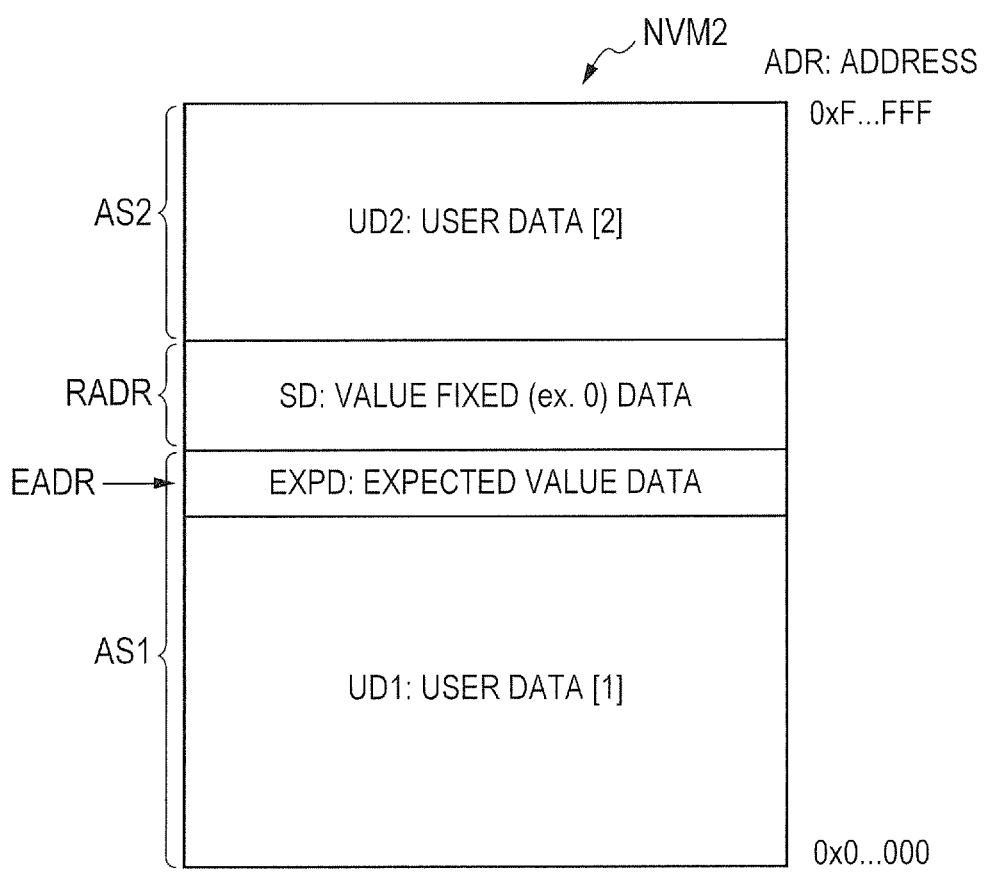
FIG. 12 is a view showing one example of a data structure of a non-volatile memory in FIG. 11.

FIG. 12 is a view showing one example of the data structure of the non-volatile memory in FIG. 11. The non-volatile memory NVM2 shown in FIG. 12 includes address spaces AS1 and AS2 and a reservation address RADR. Similarly to the case of FIG. 4, the address space AS1 is formed by the addresses sequentially read, with the generation sequence of the addresses by the reading circuit RDCTL2 as a reference, where the user data [1] UD1 is stored. The reservation address RADR is read after the address space AS1, being formed by a single or a plurality of addresses. The value fixed data SD with the address space AS1 determined as a target is stored in the reservation address RADR.

On the other hand, the address space AS2 is read after the reservation address RADR, where the user data [2] UD2 is stored. Here, the address space AS1 includes the expected value address EADR, differently from the case of FIG. 4. The expected value address EADR stores the compression value as the expected value data EXPD, which is obtained by compressing all the data stored in the address space AS2 according to a predetermined compression algorithm for use in the compressor TRC, with the fixed value (for example, 0) by the value fixed data SD as an initial value. Further, according to this, the value fixed data SD is calculated reflecting the expected value data EXPD.

Here, the expected value address EADR can be determined arbitrarily from the addresses included in the address space AS1. As shown in FIG. 12, by determining the expected value address EADR as the last address read from the address space AS1, continuous address space can be assigned to the user data [1] UD1, which enhances the convenience of the practical use. Although it is not restricted particularly, various different programs are stored respectively in the user data [1] UD1 and the user data [2] UD2.

Calculation Method of Various Types of Diagnostic Data

Figure 13:
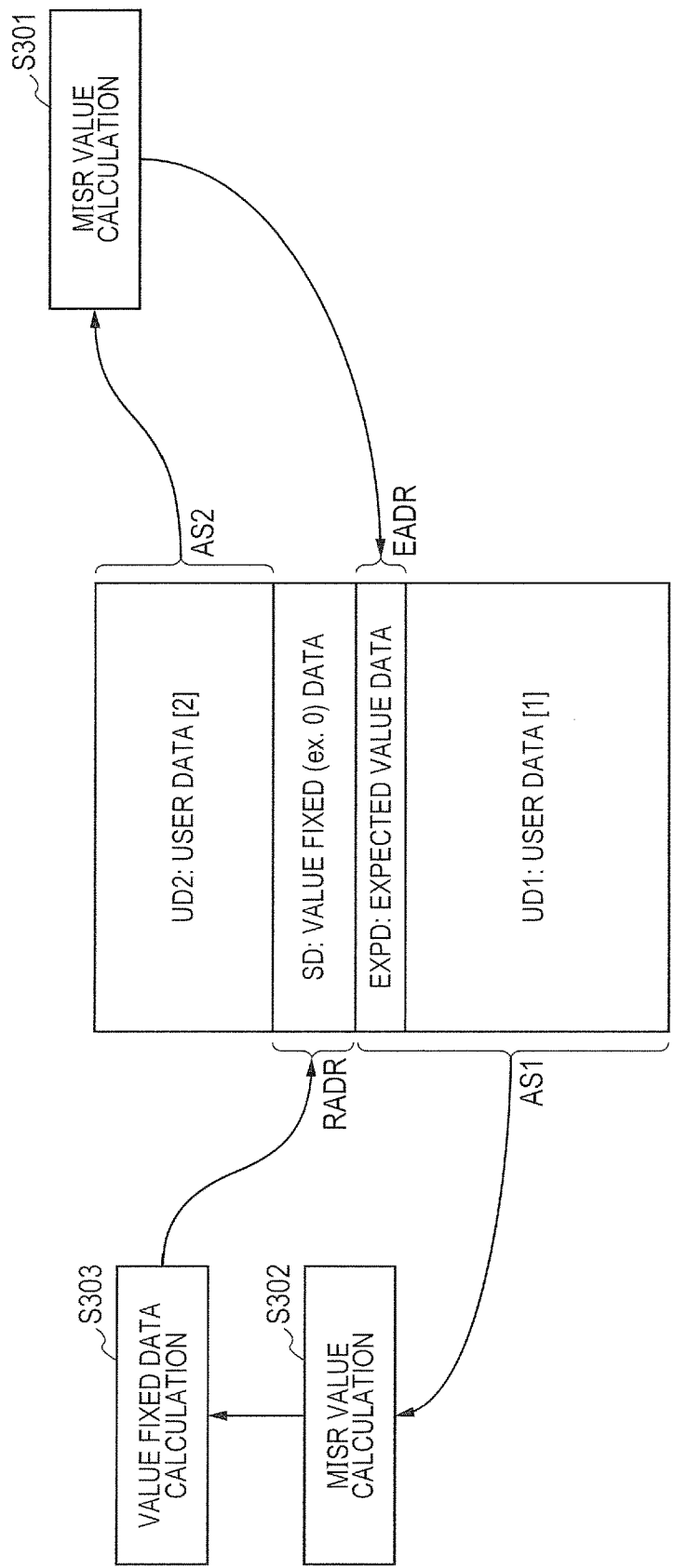
FIG. 13 is a view for use in describing one example of a method of calculating expected value data and value fixed data in the non-volatile memory of FIG. 12.

FIG. 13 is a view for use in describing one example of a calculation method of the expected value data and the value fixed data in the non-volatile memory of FIG. 12. The expected value data EXPD and the value fixed data SD are calculated by the information processing unit IM shown in FIG. 6B executing the diagnostic data calculation program PGM1. The information processing unit IM calculates the compression value (MISR value) as the expected value data EXPD in the case of compressing the user data [2] UD2 wanted to be stored in the address space AS2, according to the predetermined compression algorithm for use in the compressor TRC, with the fixed value (specifically, a predetermined fixed value) by the value fixed data SD as the initial value. Then, the information processing unit IM determines the above expected value data EXPD as the data for the predetermined expected value address EADR (Step S301).

Continuously, the information processing unit IM calculates the MISR value (Step S302) using the data wanted to be stored in the address space AS1 (specifically, the user data [1] UD1 including the expected value data EXPD), similarly to the case of the first embodiment. Further, the information processing unit IM calculates the value fixed data SD, using the above MISR value, similarly to the case of the first embodiment and determines the value fixed data SD as the data for the reservation address RADR (Step S303). Then, the information processing unit IM writes the expected value data EXPD and the value fixed data SD thus calculated and the user data [1] UD1 and [2] UD2 in the corresponding address of the non-volatile memory NVM2.

Changing State of Signature Value According to Execution of Self-Diagnosis

Figure 14:
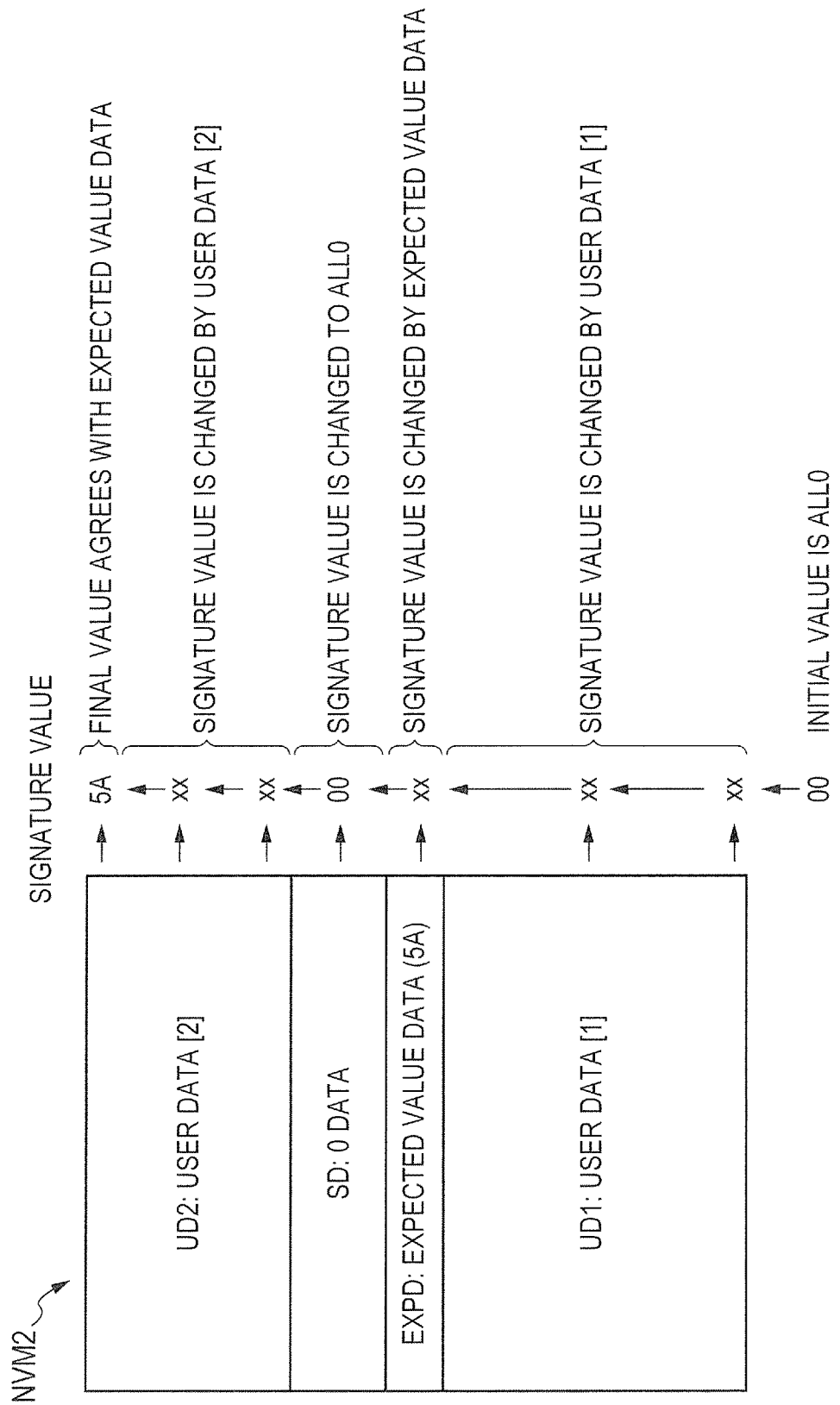
FIG. 14 is a view for use in describing a changing state of a signature value accompanying the operation of the BIST circuit in the semiconductor device of FIG. 11.

FIG. 14 is a view for use in describing a changing state of a signature value according to the operation of the BIST circuit in the semiconductor device of FIG. 11. When incrementing the addresses ADR one by one with the initial values of the shift registers of the compressor TRC set at all "0", the signature value SG changes according to the user data [1] UD1. Further, the signature value SG changes according to the expected value data EXPD (here, supposed to be "5A"). Then, the signature value SG is once returned to the fixed value (0) by the value fixed (here, 0) data SD.

Continuously, the signature value SG changes according to the user data [2] UD2 with the fixed value as the initial value. As the result, the signature value SG becomes the MISR value of the user data [2] UD2 and agrees with the expected value data EXPD ("5A"). When the user data [1] UD1 is damaged, the convergence value by the value fixed data SD is different from the predetermined fixed value; as the result, the MISR value of the user data [2] UD2 is also different from the expected value data EXPD. When the user data [2] UD2 is also damaged, the MISR value thereof is different from the expected value data EXPD.

Execution Procedure of Self-Diagnosis (Second Embodiment)

Figure 15:
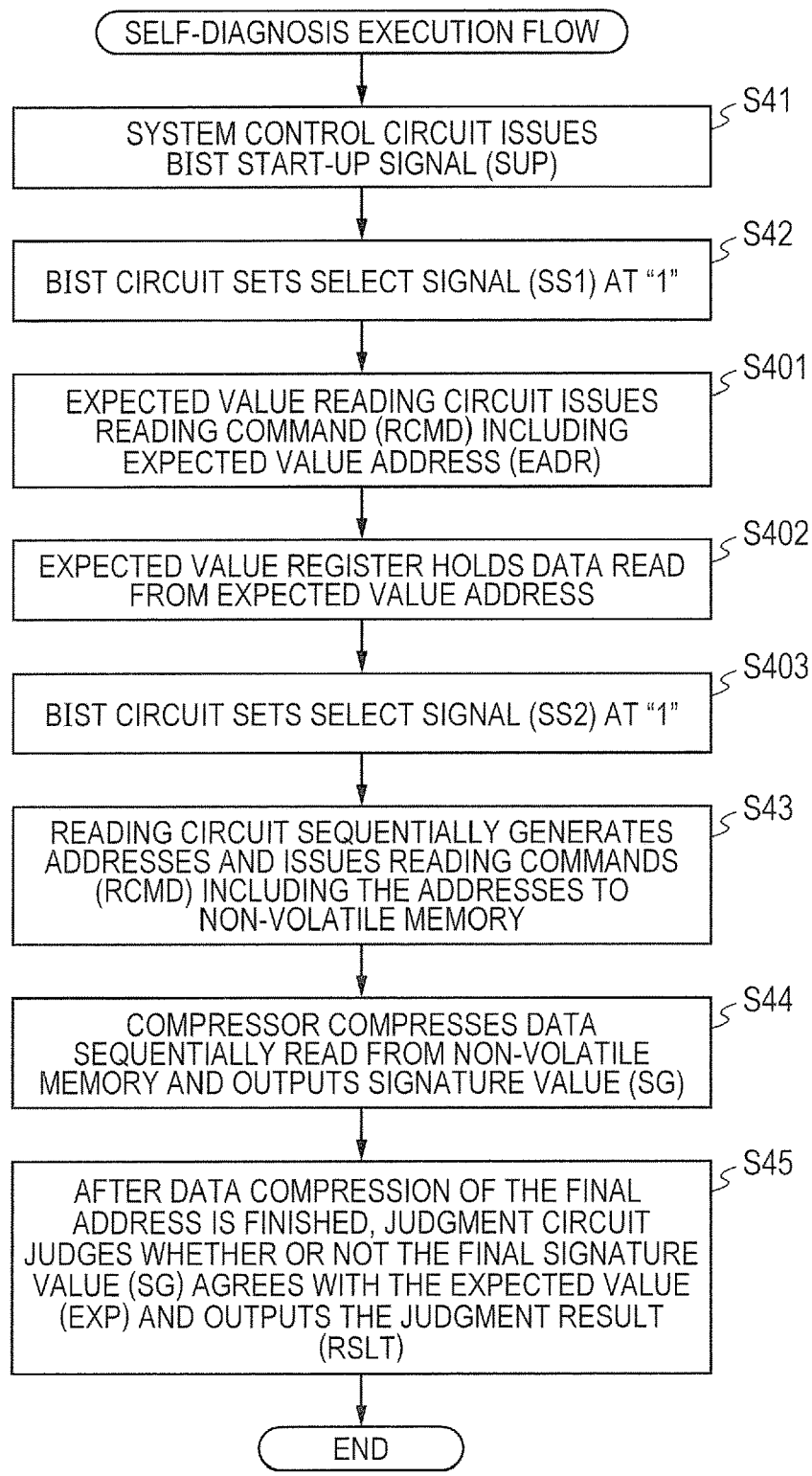
FIG. 15 is a flow chart showing one example of the procedure of executing a self-diagnosis in the semiconductor device of FIG. 11.

FIG. 15 is a flow chart showing one example of an execution procedure of the self-diagnosis in the semiconductor device of FIG. 11. The flow chart of FIG. 15 is different from the flow chart shown in FIG. 3 in that Steps S401 to S403 are inserted between Step S42 and Step S43. In Step S401, the reading circuit (expected value reading circuit) RDCTL2 issues the reading command RCMD including the predetermined expected value address EADR. Here, the selector SEL2 is to select the default "0" and the above reading command RCMD is input to the non-volatile memory NVM2 sequentially through the selectors SEL2 and SEL1.

In Step S402, the expected value register REGe holds the data (expected value data EXPD) read from the expected value address EADR. In Step S403, the BIST circuit BSTC2 (for example, the reading circuit RDCTL2) sets the select signal SS2 at "1", in order to output the address from the address counter ACNT through the selector SEL2. Hereinafter, similarly to the case of FIG. 3, the processing in Steps S43 to S45 is performed. In Step S45, the judgment circuit JDG judges whether or not the data held in the expected value register REGe (specifically, the expected value data EXPD) agrees with the signature value SG.

The expected value address EADR generated by the expected value address generating circuit EADRG can be set variable depending on a user's request. Although it is not particularly restricted, the value of the expected value address EADR itself is stored, for example, in a predetermined address within the non-volatile memory NVM2. A user can change the value of the expected value address EADR stored in this predetermined address and the expected value address reading circuit can read the predetermined address at start-up to obtain the expected value address EADR. Further, this predetermined address can be targeted for the self-diagnosis. In this case, the value of the expected value address EADR stored in the predetermined address is handled by the diagnostic data calculation program PGM1 of FIG. 6B in the same way as the user data and targeted for calculation of the MISR value.

Main Effect of Second Embodiment

As mentioned above, according to the second embodiment, by combination of the expected value data EXPD with the value fixed data SD, the expected value (actually corresponding to the expected value data EXPD and the value fixed data SD) can be stored in the diagnosis target non-volatile memory and the address with the expected value stored there can be diagnosed. As the result, similarly to the case of the first embodiment, the start time diagnosis of the non-volatile memory can be realized without any external device and any non-volatile memory out of the diagnosis target. According to this, the overhead according to the self-diagnosis can be suppressed. Further, differently from the first embodiment, the address where to store the expected value is not restrictive. In other words, the reservation address RADR does not always have to be secured in the final address portion and the expected value address EADR and the reservation address RADR can be determined arbitrarily.

Third Embodiment

Data Structure of Non-Volatile Memory (Third Embodiment)

Figure 16:
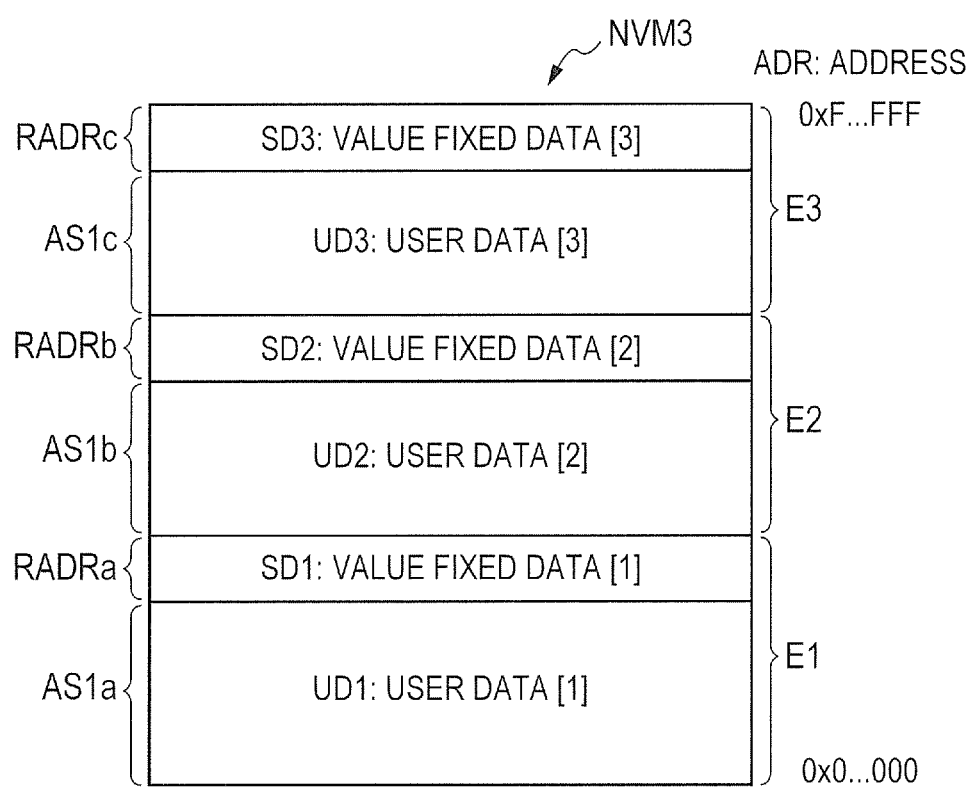
FIG. 16 is a view showing one example of a data structure of a non-volatile memory in the semiconductor device according to a third embodiment of the invention.

FIG. 16 is a view showing one example of the data structure of a non-volatile memory in a semiconductor device according to a third embodiment of the invention. The semiconductor device including the non-volatile memory is formed by applying the non-volatile memory NVM3 of FIG. 16 to the structure of FIG. 1. The non-volatile memory NVM3 of FIG. 16 includes a plurality of combination sets (in this example, three sets) of the address space AS1 and the reservation address RADR shown in FIG. 4.

The respective user data [1] UD1, [2] UD2, and [3] UD31 is stored in the respective first, second, and third address spaces AS1a, AS1b, and AS1c. The respective value fixed data [1] SD1, [2] SD2, and [3] SD31 is stored in the respective first, second, and third reservation addresses RADRa, RADRb, and RADRc. The address space (AS1b) of the latter set (for example, second set) is read after the reservation address (RADRa) of the previous set (first set). The value fixed data (SD2) stored in the reservation address (RADRb) of the latter set (for example, second set) is calculated by setting the fixed value (specifically, the fixed value by the value fixed data [1] SD1) determined by targeting the previous set (first set) as the initial value.

When this non-volatile memory NVM3 is diagnosed by the BIST circuit BSTC of FIG. 1, the final signature value SG of the compressor TRC in the normal operation becomes the fixed value (specifically, the fixe value by the value fixed data [3] SD3) determined by targeting the last set. Therefore, the judgment circuit JDG judges whether or not the fixed value of the last set agrees with the signature value SG. When the user data [1] UD1 is damaged, the fixed value by the value fixed data [1] SD1 is different from the predetermined fixed value and as the result, the fixed values by the value fixed data [2] SD2 and [3] SD3 are different from the predetermined fixed value.

When this non-volatile memory NVM3 is used, the above-mentioned sets (areas E1 to E3 in FIG. 16) can be handled independently, in calculation of various types of diagnostic data (here, value fixed data). In other words, when the user data of a certain set is changed, the user data of the other set is not necessary. For example, when the user data [2] UD2 is changed, the value fixed data [2] SD2 can be calculated, indifferently of the data of the other sets, only by using the changed user data [2] UD2 and the fixed value (specifically, the predetermined fixed value) determined by targeting the previous set.

Figure 17:
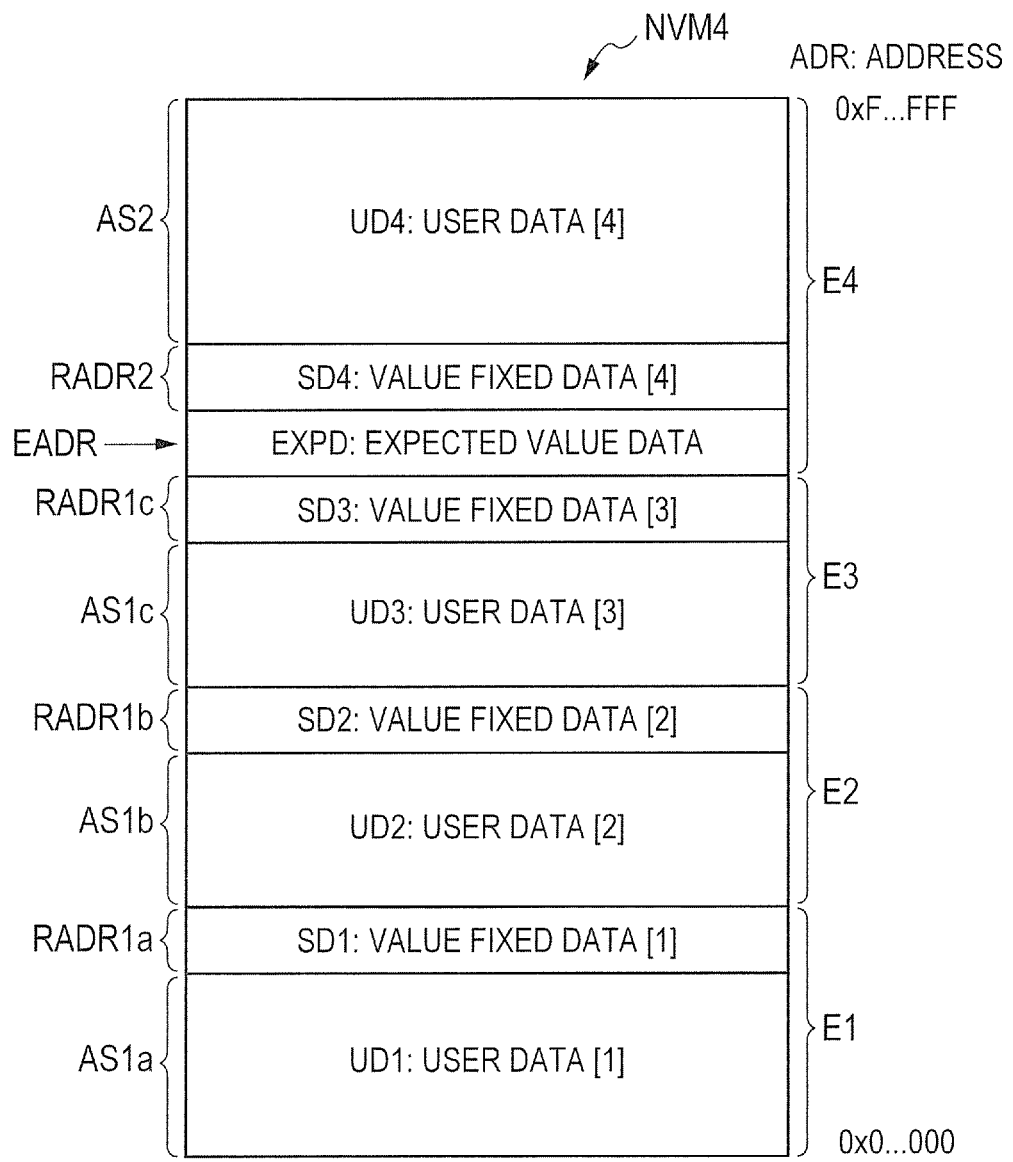
FIG. 17 is a view showing one example of another data structure of the non-volatile memory in the semiconductor device according to the third embodiment of the invention.

FIG. 17 is a view showing one example of another data structure of the non-volatile memory in the semiconductor device according to the third embodiment of the invention. The semiconductor device including the non-volatile memory is formed by applying the non-volatile memory NVM4 of FIG. 17 to the structure of FIG. 11. The non-volatile memory NVM4 of FIG. 17 is formed by adding the expected value address EADR, the reservation address RADR2, and the address space AS2 to the data structure of the non-volatile memory NVM3 shown in FIG. 16.

The expected value address EADR is read after the reservation address (RADR1c) of the last set (third set) in FIG. 16 and the expected value data EXPD is stored there. The reservation address RADR2 is read after the expected value address EADR and the value fixed data [4] SD4 is stored there. The address space AS2 is read after the reservation address RADR2 and the user data [4] UD4 is stored there.

The expected value data EXPD is determined by the MISR value in the case of compressing all the data stored in the address space AS2 according to a predetermined compression algorithm used in the compressor TRC, with the fixed value (defined as fixed value A) by the value fixed data [4] SD4 as the initial value. The value fixed data [4] SD4 is the data for converging the compression value to the fixed value A when compressing the expected value data EXPD and the value fixed data [4] SD4 according to a predetermined compression algorithm, with the fixed value (specifically, the fixed value by the value fixed data [3] SD3) determined by targeting the last set (third set) in FIG. 16 as the initial value.

When this non-volatile memory NVM4 is diagnosed by the BIST circuit BSTC2 of FIG. 11, the final signature value SG of the compressor TRC in the normal operation agrees with the expected value data EXPD. Therefore, the judgment circuit JDG judges whether or not the data stored in the expected value address EADR (specifically, the data stored by the expected value register REGe) agrees with the signature value SG.

Also by using this non-volatile memory NVM4, it is possible to calculate various types of diagnostic data (here, the value fixed data and the expected value data) independently in the respective sets, similarly to the case of FIG. 16. The respective sets include one set (area E4 in FIG. 17) formed by the expected value address EADR, the reservation address RADR2, and the address space AS2, in addition to the same three sets (areas E1 to E3 in FIG. 17) as in FIG. 16.

For example, when the user data [4] UD4 is changed, the changed user data [4] UD4 and the fixed value (specifically, a predetermined fixed value) by the value fixed data [4] SD4 can be used to calculate the expected value data EXPD and the value fixed data [4] SD4 can be calculated by this expected value data EXPD and the fixed value determined by targeting the previous set (E3 in FIG. 17). In other words, the information of the fixed value by the value fixed data [3] SD3 is necessary but the user data [3] UD3 and the value fixed data [3] SD3 itself are not necessary.

Figure 18:
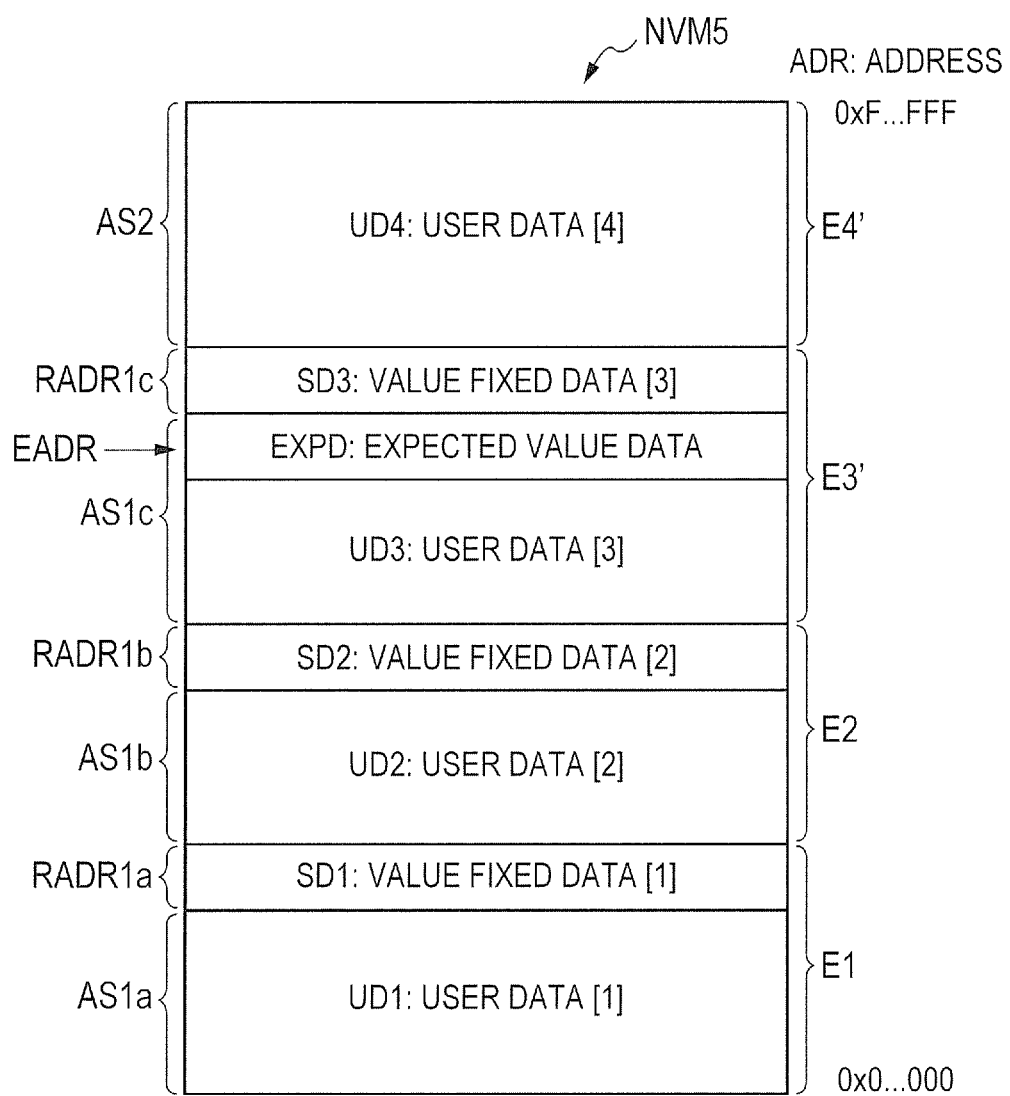
FIG. 18 is a view showing one example of a data structure of a non-volatile memory as a comparison example of FIG. 17.

FIG. 18 shows one example of the data structure of a non-volatile memory as a comparison example of FIG. 17. The non-volatile memory NVM5 shown in FIG. 18 is formed by simply combining the data structure of FIG. 4 and the data structure of FIG. 12. Specifically, in the example of FIG. 18, similarly to the case of FIG. 12, the final address of the address space AS1c is determined in the expected value address EADR. The expected value address EADR may be one of the addresses included in the address spaces AS1a, AS1b, and AS1c in principle.

According to the data structure as shown in FIG. 18, however, it is sometimes difficult to handle the data independently in each set, differently from the case of FIG. 17. For example, when the user data [4] UD4 is changed, the expected value data EXPD has to be calculated again and by using this calculation result and the user data [3] UD3, the value fixed data [3] SD3 has to be calculated again.

Main Effect of Third Embodiment

As mentioned above, according to the third embodiment, it is possible to manage a lot of user data independently, in addition to the same effect as in the case of the first or second embodiment. As the result, for example, even when a part of the user data is in non-public status because of confidential reason, data update for start time diagnosis can be performed without problem. In other words, for example, when the user data [3] UD3 is not open in FIG. 18, there is a possibility that data update of the user data [4] UD4 cannot be performed; in FIG. 17, however, this situation never happens.

Fourth Embodiment

Schematic Structure of Semiconductor Device (Fourth Embodiment)

Figure 19:
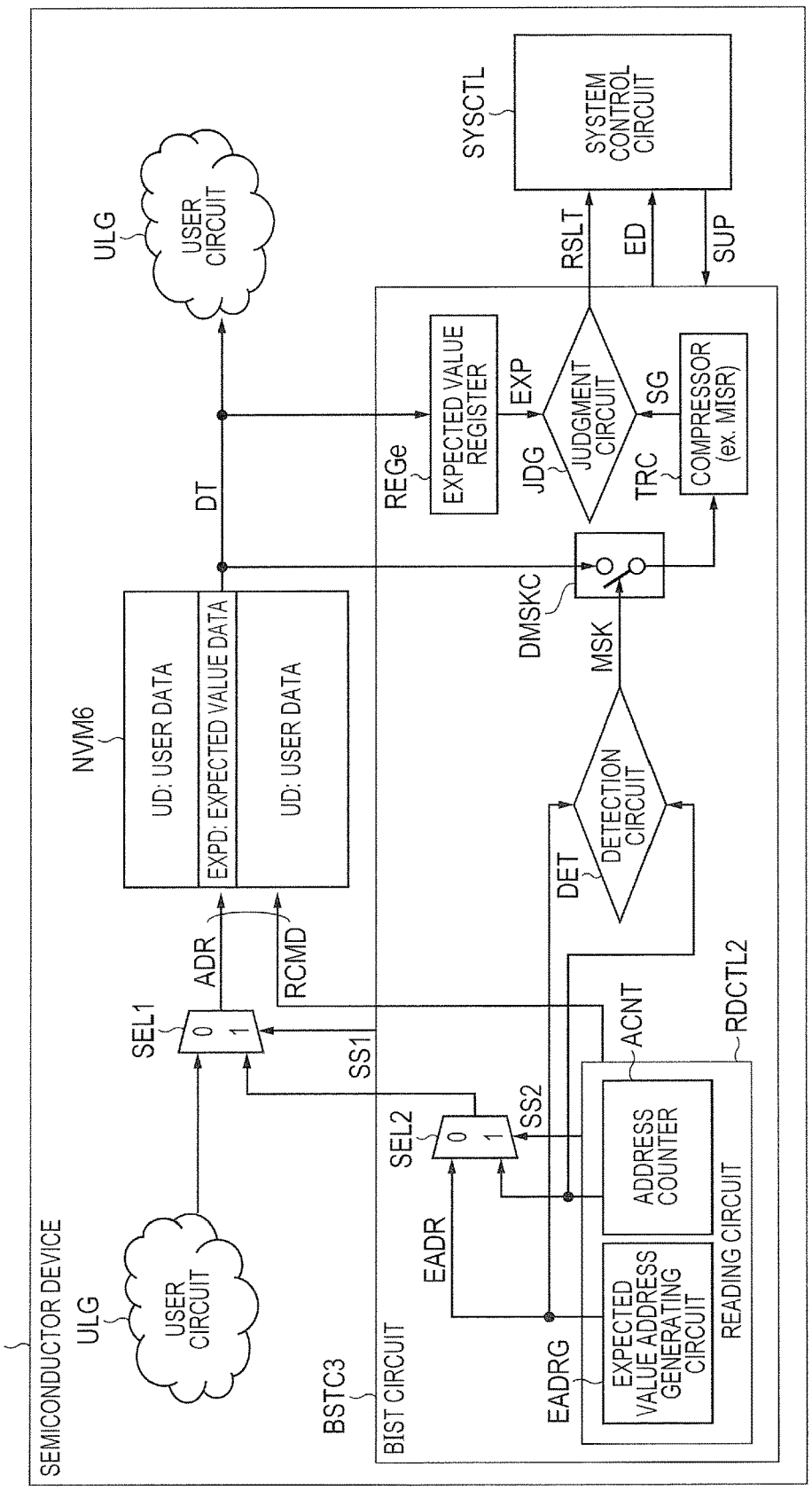
FIG. 19 is a schematic view showing a structural example of a semiconductor device according to a fourth embodiment of the invention.

FIG. 19 is a schematic view showing a structural example of a semiconductor device according to a fourth embodiment of the invention. In the semiconductor device DEV shown in FIG. 19, the data structure of the non-volatile memory NVM6 and the structure of the BIST circuit BSTC3 are different from those of FIG. 11. The BIST circuit BSTC3 further includes a detection circuit DET an a data mask circuit DMSKC, in addition to the structure of the BIST circuit BSTC2 of FIG. 11.

One of the addresses of the non-volatile memory NVM6 is an arbitrarily determined expected value address EADR, and in the expected value address EADR, the expected value data EXPD previously calculated is stored. The user data UD is stored in the space except the expected value address EADR. The expected value data EXPD is determined at the MISR value in the case of compressing all the data stored in the respective addresses except the expected value address EADR according to a predetermined compression algorithm used in the compressor TR, using the predetermined initial value (initial value of the compressor TRC)

The expected value address generating circuit EADRG always outputs the expected value address EADR. The detection circuit DET is, for example, a comparator, which detects the reading command RCMD including the address in accordance with the expected value address EADR, issued by using the address counter ACNT. The data mask circuit DMSKC controls the data DT read according to the reading command RCMD detected by the detection circuit DET to be excluded from a compression target by the compressor TRC.

Although it is not restricted particularly, as a concrete example, the detection circuit DET asserts a mask signal MSK during the reading cycle when detecting the corresponding reading command RCMD. The data mask circuit DMSKC is formed by, for example, a latch circuit with enable function and during the assert period of the mask signal MSK, the latch is disabled to keep the data DT during the reading cycle as it is.

According to this structure, the expected value data EXPD can be excluded from the compression target; therefore, the dilemma of causal link as mentioned in FIG. 20 does not occur and the expected value data EXPD can be stored in the non-volatile memory NVM6. The judgment circuit JDG judges whether or not the data stored in the expected value register REGe, read from the expected value address EADR agrees with the signature value SG, similarly to the case of FIG. 11.

Main Effect of Fourth Embodiment

As mentioned above, also the fourth embodiment can store the expected value in the diagnosis target non-volatile memory. As the result, similarly to the cases of the first and the second embodiments, the start time diagnosis of the non-volatile memory can be realized without any external device and any non-volatile memory out of the diagnosis target, hence to suppress the overhead accompanying the self-diagnosis. Further, the address where to store the expected value is not restrictive.

Differently from the first and the second embodiments, it is hard to directly diagnose the address having the expected value stored. For example, when the data of the expected value address EADR is damaged, the expected value itself becomes abnormal and generally becomes in disagreement as the judgment result by the judgment circuit JDG; therefore, indirect diagnosis is possible. Compared with the first and the second embodiments, there is a fear of increasing the overhead according to the detection circuit DET and the data mask circuit DMSKC and complicating the timing design in masking the data DT depending on the mask signal MSK in the fourth embodiment. From this viewpoint, the first and the second embodiments are preferable.

As set forth hereinabove, although the invention made by the inventor et al. have been specifically described based on the embodiments, the invention is not restricted to the embodiments but various modifications are possible without departing from the spirit. For example, the above mentioned embodiments are specifically described for the sake of easy understanding of the invention and not necessarily restricted to the form including all the components having been described. Further, a part of the structure of one embodiment can be substituted for some component in the other embodiment, and some component in one embodiment can be added to the structure of the other embodiment. Addition, deletion, and replacement of the other embodiment can be performed on a part of the structure of one embodiment.

Appendix

An information processing device according to the embodiment is a device for writing data in a non-volatile memory, on a semiconductor device including the non-volatile memory and a BIST circuit for diagnosing the non-volatile memory. The BIST circuit includes a reading circuit and a compressor. The reading circuit sequentially generates addresses and sequentially issues the reading commands including the generated addresses to the non-volatile memory. The compressor compresses the data sequentially read from the non-volatile memory in response to the reading commands from the reading circuit according to a predetermined compression algorithm and outputs a signature value as the compression result. The non-volatile memory includes a first address space formed by the addresses continuously read, with the generation sequence of the addresses by the reading circuit as a reference, and a reservation address read after the first address space, formed by a single or a plurality of addresses. The information processing device performs the first processing of calculating value fixed data, using the first user data wanted to be stored in the first address space and the second processing of storing the first user data in the first address space and storing the value fixed data in the reservation address. The value fixed data is the data for converging the compression value to a predetermined fixed value when compressing the first user data and the value fixed data according to a predetermined compression algorithm, using a predetermined initial value.

What is claimed is:

1. A semiconductor device comprising a non-volatile memory storing a first user data and a first value fixed data and a Built In Self Test (BIST) circuit for diagnosing the non-volatile memory, formed by one semiconductor chip, wherein the BIST circuit includes:
   a reading circuit that sequentially generates addresses and sequentially issues reading commands including the generated addresses to the non-volatile memory,
   a compressor that compresses the first user data and the first value fixed data sequentially read from the non-volatile memory, in response to the reading command from the reading circuit, according to a predetermined compression algorithm to output a first signature value, and
   a judgment circuit that judges whether or not a first fixed value agrees with the first signature value,
   wherein the non-volatile memory includes a first address space formed by addresses continuously read, with a generation sequence of the addresses by the reading circuit as a reference and storing the first data and a first reservation address formed by a single or a plurality of addresses, read after the first address space, and storing the first value fixed data,
   wherein when all data stored in the first address space and the first value fixed data are compressed according to the predetermined compression algorithm, the first value fixed data is data previously calculated such that the first signature value agrees with the first fixed value, and
   wherein when the first user data is rewritten to a second user data,
   the first value fixed data is rewritten to a second value fixed data, the compressor compresses the second user data and the second value fixed data to output a second signature value, the judgment circuit judges whether or not the first fixed value agrees with the second signature value, and the second value fixed data is data previously calculated such that the second signature value agrees with the first fixed value.

2. The semiconductor device according to claim 1, wherein the non-volatile memory further includes a second address space read after the first reservation address,
   wherein a compression value obtained by compressing all data stored in the second address space according the predetermined compression algorithm, with the first fixed value as an initial value, is stored in an expected value address as one of the addresses included in the first address space, and
   wherein the first value fixed data is calculated by reflecting the data in the expected value address.

3. The semiconductor device according to claim 2, wherein the expected value address is an address read last in the first address space.

4. The semiconductor device according to claim 2, wherein the BIST circuit further includes
   an expected value address reading circuit that issues a reading command including the expected value address to the non-volatile memory, and
   an expected value register that holds the data read from the expected value address in response to the reading command of the expected value address reading circuit,
   wherein the expected value address is set variable depending on a user's request, and
   wherein the judgment circuit judges whether or not the data stored in the expected value register agrees with the signature value.

5. The semiconductor device according to claim 2, wherein the first fixed value is data stored in the expected value address.

6. The semiconductor device according to claim 1, wherein the non-volatile memory includes a plurality of combination sets of the first address spaces and the first reservation addresses,
   wherein the first address space of a latter set is read after the first reservation address of a former set, and
   wherein the first value fixed data stored in the first reservation address of the above latter set is data previously calculated when all data stored in the first address space of the latter set and the first value fixed data stored in the first reservation address of the latter set are compressed, according to the predetermined compression algorithm, by setting the first fixed value determined by targeting the above former set as the predetermined initial value such that the first signature value agrees with the first fixed value determined by targeting the latter set.

7. The semiconductor device according to claim 6, wherein the non-volatile memory further includes the expected value address read after the first reservation address of the last one of the sets, a second reservation address read after the above expected value address, and a second address space read after the second reservation address,
   wherein the expected value address stores a compression value obtained by compressing all the data stored in the second address space, according to the predetermined compression algorithm, with a second fixed value as an initial value,
   wherein the second reservation address stores second value fixed data previously calculated, and
   wherein when the data stored in the expected value address and the second value fixed data are compressed, according to the predetermined compression algorithm, with the first fixed value determined by targeting the last set as an initial value, the second value fixed data is data for converging the compression value to the second fixed value.

8. The semiconductor device according to claim 7, wherein the first fixed value is data stored in the expected value address.

9. The semiconductor device according to claim 1, wherein expected value data as the first fixed value previously calculated is stored in an expected value address as one address of the non-volatile memory, wherein the BIST circuit includes
a detection circuit that detects the reading command including the address in agreement with the expected value address, and
a data mask circuit that controls the first user data and the first value fixed data read from the non-volatile memory according to the reading command detected by the detection circuit to be excluded from a processing target,
wherein the expected value data is a compression value obtained by compressing all the data stored in the respective addresses excluding the expected value address in the non-volatile memory, according to the predetermined compression algorithm, with a predetermined initial value.

10. The semiconductor device according to claim 9,
wherein the BIST circuit further includes
an expected value address reading circuit that issues a reading command including the expected value address to the non-volatile memory, and
an expected value register that holds the data read from the expected value address in response to the reading command of the expected value address reading circuit,
wherein the expected value address is set variable depending on a user's request, and
wherein the judgment circuit judges whether or not the data stored in the expected value register agrees with the signature value.

11. The semiconductor device according to claim 1,
wherein the BIST circuit further includes an expected value generating circuit that generates the first fixed value.

12. A method of diagnosing a semiconductor device comprising a non-volatile memory storing a first user data and a first value fixed data and a Built In Self Test (BIST) circuit for diagnosing the non-volatile memory,
wherein the BIST circuit includes:
a reading circuit that sequentially generates addresses and sequentially issues reading commands including the generated addresses to the non-volatile memory,
a compressor that compresses the first user and the first value fixed data sequentially read from the non-volatile memory, in response to the reading commands from the reading circuit, according to a predetermined compression algorithm to output a first signature value, and
a judgment circuit that judges whether or not a first fixed value agrees with the first signature value,
wherein the non-volatile memory includes a first address space formed by addresses continuously read, with a generation sequence of the addresses by the reading circuit as a reference and storing the first data, and a first reservation address formed by a single or a plurality of addresses, read after the first address space, and storing the first value fixed data,
the method comprising the following steps of:
(1) calculating the first value fixed data using first user data wanted to be stored in the first address space;
(2) storing the first user data in the first address space and storing the first value fixed data in the reservation address;
(3) starting up the BIST circuit to obtain the first signature value; and
(4) judging whether or not the first fixed value agrees with the first signature value obtained by Step (3),
wherein when the first user data and the first value fixed data are compressed according to the predetermined compression algorithm with a predetermined initial value, the first value fixed data is data previously calculated such that the first signature value agrees with the first fixed value, and
wherein when the first user data is rewritten to a second user data, the first value fixed data is rewritten to a second value fixed data, the compressor compresses the second user data and the second value fixed data to output a second signature value, the judgment circuit judges whether or not the first fixed value agrees with the second signature value, and the second value fixed data is data previously calculated such that the second signature value agrees with the first fixed value.

13. The method according to claim 12,
the non-volatile memory further including a second address space read after the reservation address,
the method further comprising the steps of:
(5) being performed before the step (1), calculating a compression value as expected value data when compressing third user data wanted to be stored in the second address space, according to the predetermined compression algorithm, with the first fixed value as an initial value, and (6) storing the third user data in the second address space and storing the expected value data in an expected value address as one address included in the first address space,
wherein in the step (1), the first value fixed data is calculated with the expected value data included in the first user data.

14. The method according to claim 13,
wherein the first fixed value is data stored in the expected value address.

15. The method according to claim 13,
wherein the expected value address is an address last read in the first address space.

* * * * *